(12) United States Patent
Roh et al.

(10) Patent No.: US 12,241,783 B2
(45) Date of Patent: Mar. 4, 2025

(54) MULTISPECTRAL IMAGE SENSOR AND ELECTRONIC APPARATUS INCLUDING THE SAME

(71) Applicant: SAMSUNG ELECTRONICS CO., LTD., Suwon-si (KR)

(72) Inventors: Sookyoung Roh, Yongin-si (KR); Seokho Yun, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 58 days.

(21) Appl. No.: 17/902,123

(22) Filed: Sep. 2, 2022

(65) Prior Publication Data

US 2023/0099884 A1 Mar. 30, 2023

(30) Foreign Application Priority Data

Sep. 29, 2021 (KR) .................. 10-2021-0128943

(51) Int. Cl.
*G01J 3/28* (2006.01)
*G01J 3/02* (2006.01)

(52) U.S. Cl.
CPC ........... *G01J 3/2823* (2013.01); *G01J 3/0208* (2013.01); *G01J 3/2803* (2013.01); *G01J 2003/2826* (2013.01)

(58) Field of Classification Search
CPC ...... G01J 3/2823; G01J 3/0208; G01J 3/2803; G01J 2003/2826; H01L 27/14627;
(Continued)

(56) References Cited

U.S. PATENT DOCUMENTS 8,872,086 B2 10/2014 Yamashita
9,386,206 B2 7/2016 Tanaka
(Continued)

FOREIGN PATENT DOCUMENTS

CN 104737527 B 6/2018
CN 211404504 U 9/2020
(Continued)

OTHER PUBLICATIONS

Office Action dated Mar. 23, 2023, issued by Korean Intellectual Property Office for Korean Application No. 10-2021-0128943.
(Continued)

*Primary Examiner* — Mohamed K Amara
(74) *Attorney, Agent, or Firm* — Sughrue Mion, PLLC

(57) ABSTRACT

Provided is an image sensor including a sensor substrate including a first pixel row and a second pixel row, a spacer layer arranged on the sensor substrate, and a color separating lens array arranged on the spacer layer, in which the color separating lens array includes a first color separating lens array separating, out of incident light, light of a plurality of wavelengths within a first spectral range and condensing the light of the plurality of wavelengths onto a plurality of pixels of the first pixel row and a second color separating lens array separating, out of incident light, light of a plurality of wavelengths within a second spectral range different from the first spectral range and condensing the light of the plurality of wavelengths onto a plurality of pixels of the second pixel row.

19 Claims, 39 Drawing Sheets

(58) Field of Classification Search
CPC ......... H01L 27/14621; H01L 27/14625; H01L 27/14603; H01L 27/1463; G02B 3/0037; G02B 5/3083
See application file for complete search history.

(56) References Cited

U.S. PATENT DOCUMENTS

| | | | |
|---|---|---|---|
| 9,712,752 | B2 | 7/2017 | Izawa |
| 9,841,604 | B2* | 12/2017 | Roh .................... G02B 3/0006 |
| 10,764,521 | B2 | 9/2020 | Usui et al. |
| 2015/0185380 | A1* | 7/2015 | Miyashita ......... H01L 27/14627 348/739 |
| 2015/0286060 | A1 | 10/2015 | Roh et al. |
| 2015/0323800 | A1* | 11/2015 | Nam .................. G02B 27/4205 359/558 |
| 2020/0043966 | A1 | 2/2020 | Lee |
| 2021/0124179 | A1 | 4/2021 | Yun et al. |
| 2021/0125301 | A1 | 4/2021 | Park et al. |
| 2021/0126029 | A1 | 4/2021 | Roh et al. |
| 2021/0126032 | A1 | 4/2021 | Roh et al. |
| 2021/0126035 | A1 | 4/2021 | Roh et al. |
| 2021/0167110 | A1 | 6/2021 | Roh et al. |
| 2022/0344399 | A1* | 10/2022 | Ahn .................. H01L 27/14645 |
| 2023/0222654 | A1 | 7/2023 | Fan et al. |
| 2023/0238409 | A1* | 7/2023 | Roh .................... G02B 3/0087 257/432 |
| 2024/0063242 | A1* | 2/2024 | Yun .................. H01L 27/14621 |
| 2024/0079431 | A1* | 3/2024 | Roh ........................ H04N 23/12 |
| 2024/0204022 | A1 | 6/2024 | Roh et al. |

FOREIGN PATENT DOCUMENTS

| | | | |
|---|---|---|---|
| CN | 112702545 A | 4/2021 | |
| CN | 113260835 A | 8/2021 | |
| EP | 3812801 A1 * | 4/2021 | ............. G02B 1/002 |
| EP | 3812803 A1 | 4/2021 | |
| KR | 10-2010-0057695 A | 5/2010 | |
| KR | 1020180086722 A | 8/2018 | |
| KR | 10-2021-0048401 A | 5/2021 | |
| KR | 10-2021-0049670 A | 5/2021 | |
| KR | 1020210048985 A | 5/2021 | |
| KR | 1020210048987 A | 5/2021 | |
| KR | 1020210066705 A | 6/2021 | |
| WO | 2013/145433 A1 | 10/2013 | |

OTHER PUBLICATIONS

Extended European Search Report dated Jan. 25, 2023, issued by European Patent Office for EP Patent Application No. 22193900.2.
Office Action issued on May 20, 2024 by the Chinese Patent Office in corresponding CN Patent Application No. 202211028875.3.
Communication issued Dec. 30, 2024 by the China National Intellectual Property Administration in Chinese Patent Application No. 202211028875.3.

* cited by examiner

MULTISPECTRAL IMAGE SENSOR AND ELECTRONIC APPARATUS INCLUDING THE SAME

CROSS-REFERENCE TO RELATED APPLICATION

This application is based on and claims priority under 35 U.S.C. § 119 to Korean Patent Application No. 10-2021-0128943, filed on Sep. 29, 2021, in the Korean Intellectual Property Office, the disclosure of which is incorporated by reference herein in its entirety.

BACKGROUND

1. Field

The disclosure relates to a multispectral image sensor capable of obtaining multispectral information due to inclusion of a color separating lens array that condenses incident light separately according to wavelengths of the incident light, and an electronic apparatus including the multispectral image sensor.

2. Description of the Related Art

Recently, the demand for an image sensor capable of detecting a slight change in color or appearance that occurs in an object according to a change in a construction or composition of the object. For example, a multispectral image sensor capable of detecting a change of a spectrum reflected from a surface of an object may be used to determine a disease of a human organ such as skin, inspect food, easily detect deforestation, etc. Regarding a multispectral image sensor based on a color filter, the color filter absorbs light of wavelength bands other than light of a specific wavelength band, and thus, the light utilization efficiency of the multispectral image sensor is reduced. Moreover, as the size of the image sensor decreases to obtain high resolution, the sensitivity in a unit pixel may decrease.

SUMMARY

Provided are a multispectral image sensor having improved light utilization efficiency due to use of a color separating lens array capable of condenses incident light separately according to wavelengths of the incident light, and an electronic apparatus including the multispectral image sensor.

Additional aspects will be set forth in part in the description which follows and, in part, will be apparent from the description, or may be learned by practice of the presented example embodiments of the disclosure.

According to an aspect of the disclosure, there is provided an image sensor including: a sensor substrate including a first pixel row and a second pixel row, the first pixel row including a plurality of first pixels arranged in a first direction and the second pixel row including a plurality of second pixels arranged in the first direction, the second pixel row being adjacent to the first pixel row in a second direction; a spacer layer that is transparent and is provided on the sensor substrate; and a color separating lens array provided on the spacer layer, wherein the color separating lens array includes: a first color separating lens array extending in the first direction over the first pixel row, the first color separating lens array being configured to separate from light incident on the first color separating lens array, light of a plurality of first wavelengths within a first spectral range and condense the light of the plurality of first wavelengths onto the plurality of first pixels of the first pixel row; and a second color separating lens array extending in the first direction over the second pixel row, the second color separating lens array being configured to separate from light incident on the second color separating lens array, light of a plurality of second wavelengths within a second spectral range different from the first spectral range and condense the light of the plurality of second wavelengths onto the plurality of second pixels of the second pixel row.

The second color separating lens array is adjacent to the first color separating lens array in the second direction.

The first color separating lens array is further configured to condense the light incident on the first color separating lens array onto only the plurality of first pixels of the first pixel row, and the second color separating lens array is configured to condense light incident on the second color separating lens array onto only the plurality of second pixels of the second pixel row.

The image sensor further includes an isolating layer arranged on the color separating lens array, the isolation layer configured to prevent energy exchange between the first color separating lens array and the second color separating lens array.

The isolating layer includes a first transparent bar extending in the first direction on the first color separating lens array and a second transparent bar extending in the first direction on the second color separating lens array.

The isolating layer includes a transparent flat plate including a groove formed concavely in the first direction at a position corresponding to an interface between the first color separating lens array and the second color separating lens array.

An upper surface of the isolating layer includes a convex curved surface and the upper surface of the isolating layer has refractive power in the second direction.

The first spectral range and the second spectral range partially overlap each other.

A first wavelength gap between the plurality of first wavelengths within the first spectral range separated by the first color separating lens array and a second wavelength gap between the plurality of second wavelengths within the second spectral range separated by the second color separating lens array are within a range of about 30 nm to about 300 nm.

The plurality of first pixels of the first pixel row include a first pixel, a second pixel, and a third pixel that are alternately arranged in the first direction, and wherein the plurality of second pixels of the second pixel row include a fourth pixel, a fifth pixel, and a sixth pixel that are alternately arranged in the first direction.

The first color separating lens array is configured to: change a phase of light of a first wavelength from the light incident on the first color separating lens array, and condense the phase-changed light of the first wavelength onto the first pixel, change a phase of light of a second wavelength from the light incident on the first color separating lens array, and condense the phase-changed light of the second wavelength onto the second pixel, and change a phase of light of a third wavelength from the light incident on the first color separating lens array, and condense the phase-changed light of the third wavelength onto the third pixel, and the second color separating lens array is configured to: change a phase of light of a fourth wavelength from the light incident on the second color separating lens array, and condense the phase-changed light of the fourth wavelength onto the fourth pixel, change a phase of light of a fifth wavelength from the light incident on the second color separating lens array, and condense the phase-changed light of the fifth wavelength onto the fifth pixel, and change a phase of light of a sixth wavelength from the light incident on the second color separating lens array, and condense the phase-changed light of the sixth wavelength onto the sixth pixel.

The first color separating lens array includes a first region corresponding to the first pixel, a second region corresponding to the second pixel, and a third region corresponding to the third pixel, the first region, the second region and the third region are alternately arranged in the first direction, the second color separating lens array includes a fourth region corresponding to the fourth pixel, a fifth region corresponding to the fifth pixel, and a sixth region corresponding to the sixth pixel, the fourth region, the fifth region and the sixth region are alternately arranged in the first direction, the first region is arranged to face the first pixel, the second region is arranged to face the second pixel, the third region is arranged to face the third pixel, the fourth region is arranged to face the fourth pixel, the fifth region is arranged to face the fifth pixel, and the sixth region is arranged to face the sixth pixel.

Each of the first region, the second region, and the third region include a plurality of nanostructures that are arranged such that: the light of the first wavelength at a position immediately after passing through the first color separating lens array has a phase of about $2\pi$ at a first position corresponding to a central portion of the first pixel and has a phase of about $0.9\pi$ to about $1.1\pi$ in a boundary between the second pixel and the third pixel, the light of the second wavelength at the position immediately after passing through the first color separating lens array has a phase of about $2\pi$ at a second position corresponding to a central portion of the second pixel and has a phase of about $0.9\pi$ to about $1.1\pi$ in a boundary between the third pixel and the first pixel, and the light of the third wavelength at the position immediately after passing through the first color separating lens array has a phase of about $2\pi$ at a third position corresponding to a central portion of the third pixel and has a phase of about $0.97\pi$ to about $1.1\pi$ in a boundary between the first pixel and the second pixel.

Each of the first region, the second region, the third region, the fourth region, the fifth region and the sixth region includes a plurality of nanostructures, which are arranged such that the light of the first wavelength at a position immediately after passing through the color separating lens array has a phase greater than about $1\pi$ and less than about $2\pi$ at a position corresponding to the fourth pixel that is adjacent to the first pixel in the second direction.

The plurality of nanostructures are arranged such that the light of the first wavelength, the light of the second wavelength, and the light of the third wavelength, which have passed through the first color separating lens array, do not proceed to the fourth pixel, the fifth pixel, and the sixth pixel.

A first-direction width of each of the plurality of nanostructures of the first region, the second region, and the third region is less than a shortest wavelength among the first wavelength, the second wavelength, and the third wavelength.

The fourth region, the fifth region, and the sixth region include a plurality of nanostructures that are arranged such that: the light of the fourth wavelength at a position immediately after passing through the second color separating lens array has a phase of about $2\pi$ at a position corresponding to a central portion of the fourth pixel and has a phase of about $0.9\pi$ to about $1.1\pi$ in a boundary between the fifth pixel and the sixth pixel, the light of the fifth wavelength at the position immediately after passing through the second color separating lens array has a phase of about $2\pi$ at a position corresponding to a central portion of the fifth pixel and has a phase of about $0.9\pi$ to about $1.1\pi$ in a boundary between the sixth pixel and the fourth pixel, and the light of the sixth wavelength at the position immediately after passing through the second color separating lens array has a phase of about $2\pi$ at a position corresponding to a central portion of the sixth pixel and has a phase of about $0.9\pi$ to about $1.1\pi$ in a boundary between the fourth pixel and the fifth pixel.

A first-direction width of each of the plurality of nanostructures of the fourth region, the fifth region, and the sixth region is less than a shortest wavelength among the fourth wavelength, the fifth wavelength, and the sixth wavelength.

The sensor substrate further includes a third pixel row provided adjacent to the second pixel row in a second direction and includes a seventh pixel, an eighth pixel, and a ninth pixel that are alternately arranged in the first direction, the color separating lens array further includes a third color separating lens array provided adjacent to the second color separating lens array in the second direction and includes a seventh region corresponding to the seventh pixel, an eighth region corresponding to the eighth pixel, and a ninth region corresponding to the ninth pixel that are alternately arranged in the first direction, the seventh region is arranged to face the seventh pixel, the eighth region is arranged to face the eighth pixel, and the ninth region is arranged to face the ninth pixel.

The third color separating lens array is configured to: change a phase of light of a seventh wavelength from light incident on the third color separating lens array, and condense the phase-changed light of the seventh wavelength onto the seventh pixel, change a phase of light of an eighth wavelength from light incident on the third color separating lens array, and condense the phase-changed light of the eighth wavelength onto the eighth pixel, and change a phase of light of a ninth wavelength from light incident on the third color separating lens array, and condense the phase-changed light of the ninth wavelength onto the ninth pixel.

A first wavelength gap between the first wavelength and the fourth wavelength is less than a second wavelength gap between the first wavelength and the second wavelength.

A third wavelength gap between the first wavelength and the second wavelength and a fourth wavelength gap between the second wavelength and the third wavelength are within a range of about 30 nm to about 300 nm.

The first wavelength gap between the first wavelength and the fourth wavelength is within a range of about 10 nm to about 100 nm.

According to another aspect of the disclosure, there is provided an electronic apparatus including: an image sensor configured to convert an optical image into an electrical signal; a processor configured to control an operation of the image sensor and store and output a signal generated by the image sensor; and a lens assembly configured to provide light corresponding to an object to the image sensor, wherein the image sensor includes: a sensor substrate including a first pixel row and a second pixel row, the first pixel row including a plurality of first pixels arranged in a first direction and the second pixel row including a plurality of second pixels arranged in the first direction, the second pixel row being adjacent to the first pixel row in a second direction; a spacer layer that is transparent and is provided on the sensor substrate; and a color separating lens array provided on the spacer layer, wherein the color separating lens array includes: a first color separating lens array extending in the first direction over the first pixel row, the first color separating lens array being configured to separate from light incident on the first color separating lens array, light of a plurality of first wavelengths within a first spectral range and condense the light of the plurality of first wavelengths onto the plurality of first pixels of the first pixel row; and a second color separating lens array extending in the first direction over the second pixel row, the second color separating lens array being configured to separate from light incident on the second color separating lens array, light of a plurality of second wavelengths within a second spectral range different from the first spectral range and condense the light of the plurality of second wavelengths onto the plurality of second pixels of the second pixel row.

According to another aspect of the disclosure, there is provided an image sensor including: a sensor substrate including a first pixel row and a second pixel row, the first pixel row including a plurality of first pixels arranged in a first direction and the second pixel row including a plurality of second pixels arranged in the first direction, the second pixel row being adjacent to the first pixel row in a second direction; a color separating lens array provided spaced apart from the sensor substrate, wherein the color separating lens array includes: a first color separating lens array extending in the first direction, the first color separating lens array being configured to: separate from light incident on the first color separating lens array, light of a plurality of first wavelengths within a first spectral range, direct the light of the plurality of first wavelengths onto the plurality of first pixels of the first pixel row, and prevent the light of the plurality of first wavelengths from being condensed onto one or more of the plurality of second pixels of the second pixel row.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
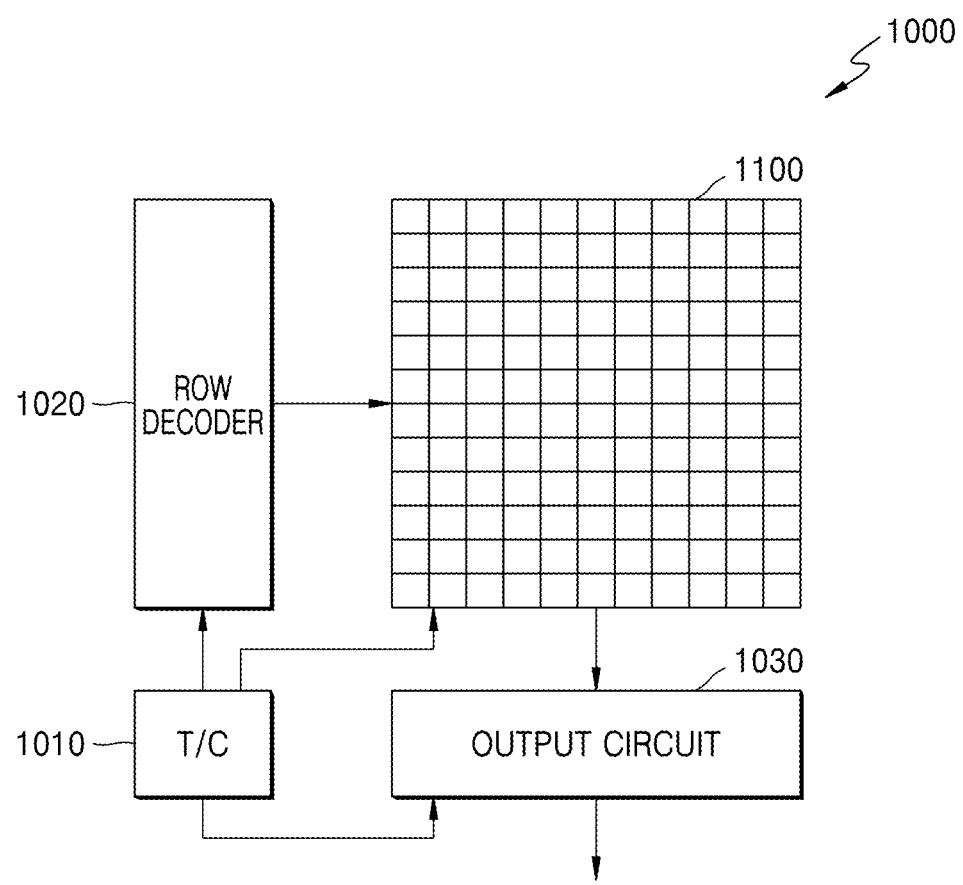
FIG. 1 is a block diagram of an image sensor according to an example embodiment.

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a multispectral image sensor including a color separating lens array and an electronic apparatus including the multispectral image sensor will be described in detail with reference to accompanying drawings. Example embodiments to be described are merely examples, and various modifications may be made from such example embodiments. In the drawings, like reference numerals denote like components, and sizes of components in the drawings may be exaggerated for convenience of explanation.

When an expression "above" or "on" may include not only "directly on/under/at left/right contactually", but also "on/under/at left/right contactlessly".

Although the terms "first," "second," etc., may be used herein to describe various components, these terms are used to distinguish one component from other components. These terms do not limit that materials or structures of components are different from one another.

Singular forms include plural forms unless apparently indicated otherwise contextually. When a portion is referred to as "comprises" a component, the portion may not exclude another component but may further include another component unless stated otherwise.

In addition, the terms such as " . . . unit", "module", etc., provided herein indicate a unit performing at least one function or operation, and may be realized by hardware, software, or a combination of hardware and software.

The use of the terms of "the above-described" and similar indicative terms may correspond to both the singular forms and the plural forms.

Also, operations constituting a method may be performed in any suitable order unless it is explicitly stated that they should be performed in an order they are described. Also, the use of all exemplary terms (for example, etc.) is only to describe technical spirit in detail, and the scope of rights is not limited by these terms unless limited by the claims.

FIG. 1 is a block diagram of an image sensor according to an example embodiment. Referring to FIG. 1, an image sensor 1000 may include a pixel array 1100, a timing controller 1010, a row decoder 1020, and an output circuit 1030. The image sensor 1000 may include a charge coupled device (CCD) image sensor or a complementary metal oxide semiconductor (CMOS) image sensor.

The pixel array 1100 may include pixels that are two-dimensionally arranged in a plurality of rows and columns. The row decoder 1020 may select one of the rows in the pixel array 1100 in response to a row address signal output from the timing controller (T/C) 1010. The output circuit 1030 may output a photosensitive signal, in a column unit, from a plurality of pixels arranged in the selected row. To this end, the output circuit 1030 may include a column decoder and an analog-to-digital converter (ADC). For example, the output circuit 1030 may include a column decoder and a plurality of ADCs arranged respectively for the columns in the pixel array 1100 or one ADC arranged at an output end of the column decoder. The timing controller 1010, the row decoder 1020, and the output circuit 1030 may be implemented as one chip or in separate chips. A processor for processing an image signal output from the output circuit 1030 may be implemented as one chip with the timing controller 1010, the row decoder 1020, and the output circuit 1030.

The image sensor 1000 may be a multispectral image sensor capable of providing a multispectral image. To this end, the pixel array 1100 may include a plurality of pixels that detect light of various wavelengths. For example, FIGS. 2A and 2B illustrate examples of various pixel arrangements in a pixel array of an image sensor.

Figure 2A:
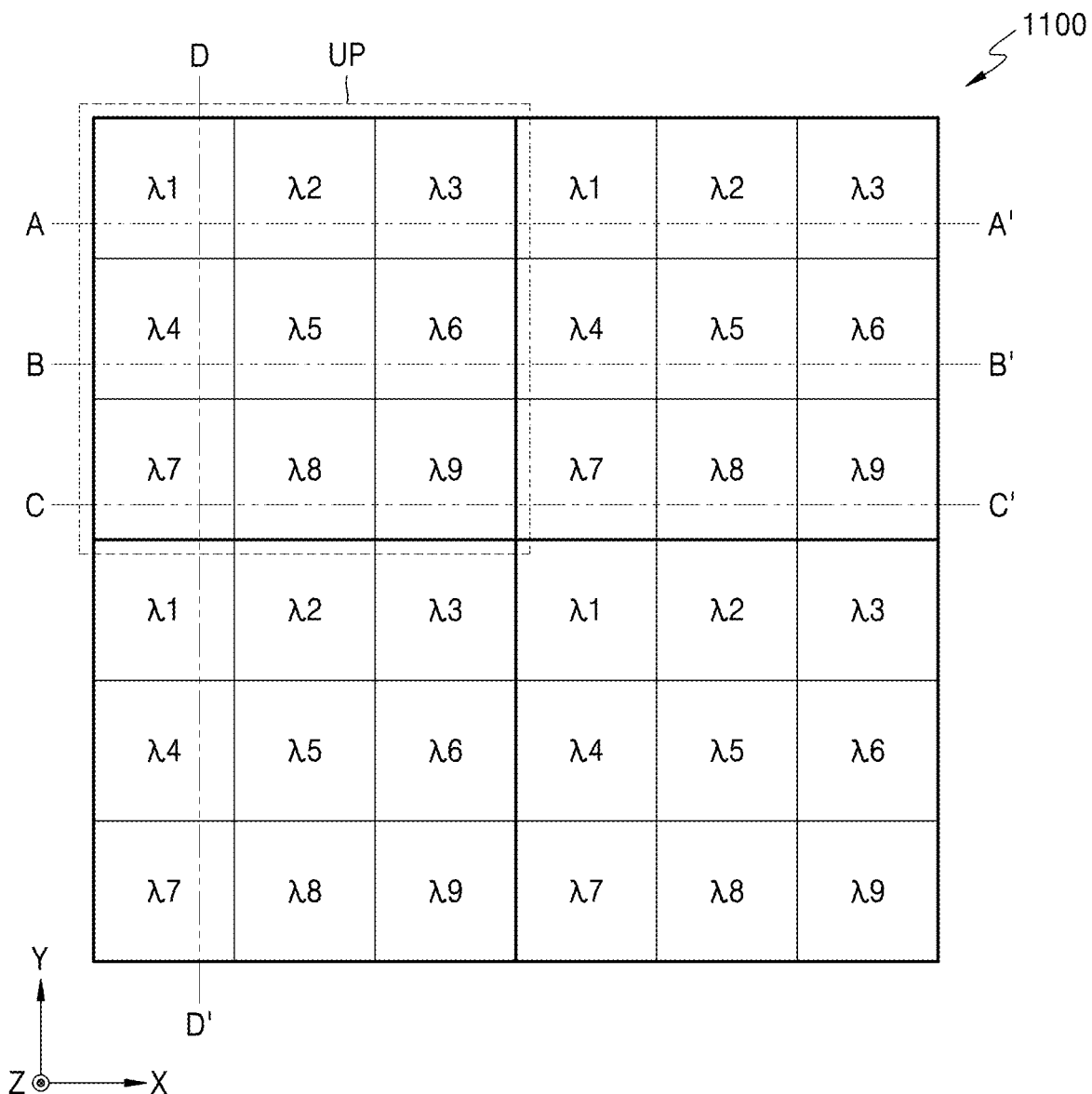
FIGS. 2A and 2B are diagrams showing examples of various pixel arrangements in a pixel array of an image sensor.
Figure 2B:
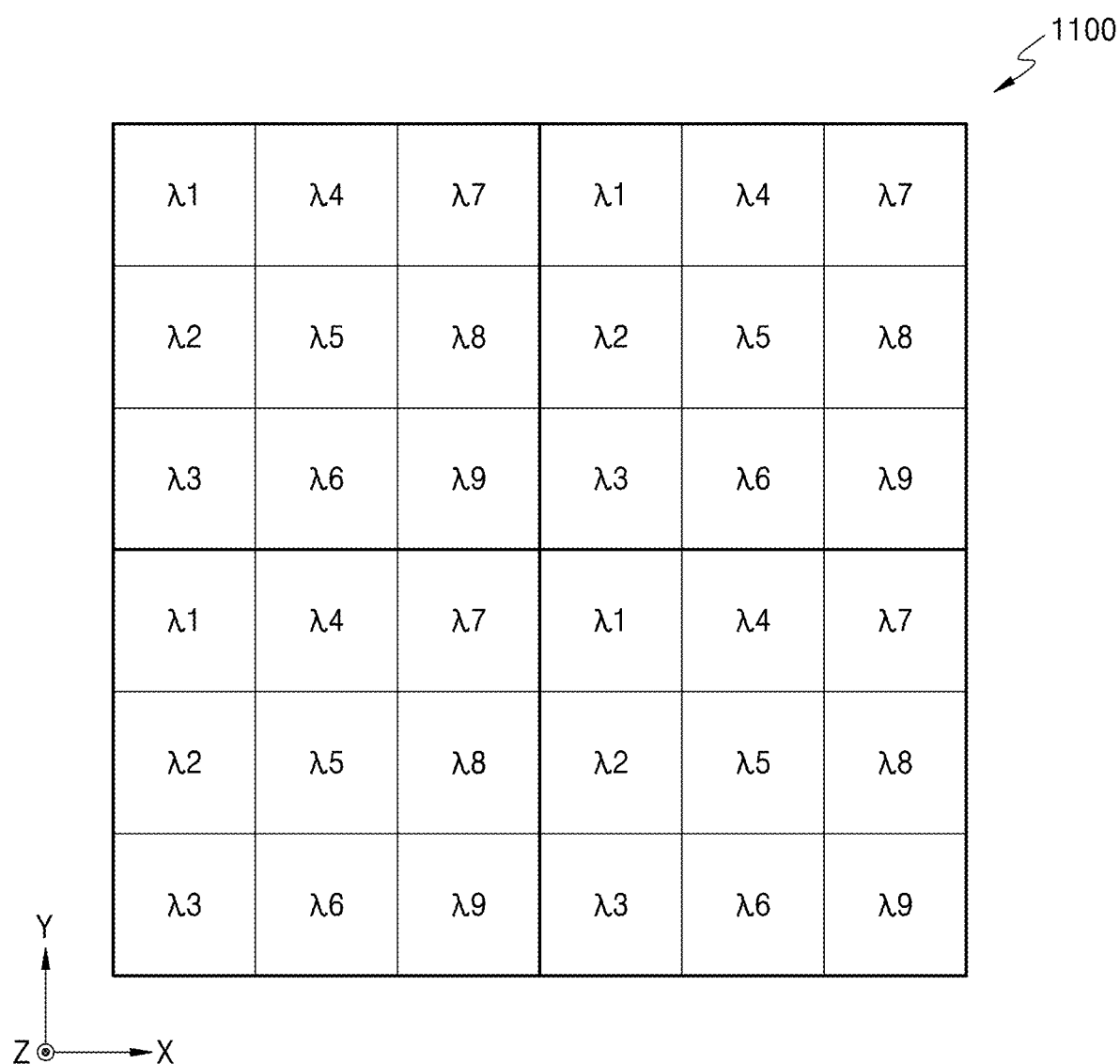

According to an example embodiment, referring to FIG. 2A, the pixel array 1100 may include a plurality of unit patterns (UP) having a 3×3 array form, and the plurality of unit patterns may be two-dimensionally arranged in a first direction (an X direction) and a second direction (a Y direction). Each unit pattern (UP) may include a first pixel that senses light of a first wavelength $\lambda 1$, a second pixel that senses light of a second wavelength $\lambda 2$, a third pixel that senses light of a third wavelength $\lambda 3$, a fourth pixel that senses light of a fourth wavelength $\lambda 4$, a fifth pixel that senses light of a fifth wavelength $\lambda 5$, a sixth pixel that senses light of a sixth wavelength $\lambda 6$, a seventh pixel that senses light of a seventh wavelength $\lambda 7$, an eighth pixel that senses light of an eighth wavelength $\lambda 8$, and a ninth pixel that senses light of a ninth wavelength $\lambda 9$. In the pixel array 1100, a plurality of pixels may be arranged in a unit of three pixel rows. For example, the first pixel, the second pixel, and the third pixel may be alternately arranged in the first direction (the X direction) in a first pixel row, the fourth pixel, the fifth pixel, and the sixth pixel may be alternately arranged in the first direction (the X direction) in a second pixel row that is adjacent to the first pixel row in the second direction (the Y direction), and the seventh pixel, the eighth pixel, and the ninth pixel may be alternately arranged in the first direction (the X direction) in a third pixel row that is adjacent to the second pixel row in the second direction (the Y direction).

A row direction and a column direction may be selected differently in the pixel array 1100. For example, referring to FIG. 2B, the first pixel, the second pixel, and the third pixel may be alternately arranged in the second direction (the Y direction) in a first pixel column, the fourth pixel, the fifth pixel, and the sixth pixel may be alternately arranged in the second direction (the Y direction) in a second pixel column that is adjacent to the first pixel column in the first direction (the X direction), and the seventh pixel, the eighth pixel, and the ninth pixel may be alternately arranged in the second direction (the Y direction) in a third pixel column that is adjacent to the second pixel column in the first direction (the X direction).

Figure 2C:
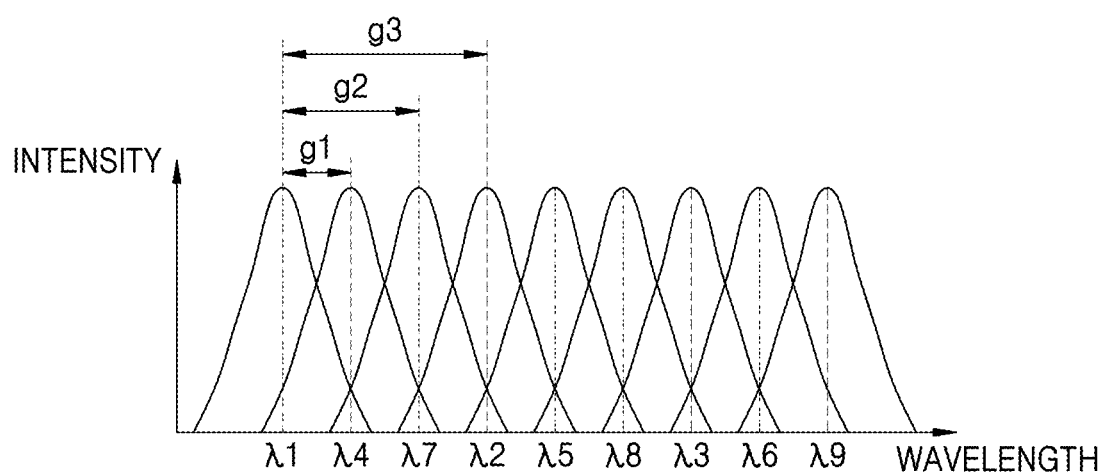
FIG. 2C is a graph showing an example of a plurality of wavelength bands sensed by the image sensor.

In order to facilitate wavelength separation in one unit pixel row or unit pixel column, wavelength bands of light detected by pixels alternately arranged in one unit pixel row or pixel unit column may be selected to overlap as little as possible. FIG. 2C is a graph showing an example of a plurality of wavelength bands detected by an image sensor. Referring to FIG. 2C, a wavelength gap between wavelengths detected by pixels in one unit pixel row or unit pixel column may be greater than that between wavelengths detected by pixels in adjacent other pixel rows or columns. That is, wavelength bands of light detected by pixels alternately arranged in one unit pixel row or unit pixel column may hardly overlap or have a low overlapping degree, and may partially overlap wavelength bands of light detected by pixels in adjacent other pixel rows or columns.

For example, a wavelength gap g3 between the first wavelength $\lambda 1$ and the second wavelength $\lambda 2$ may be greater than a wavelength gap g1 between the first wavelength $\lambda 1$ and the fourth wavelength $\lambda 4$. In addition, the wavelength gap g3 between the first wavelength $\lambda 1$ and the second wavelength $\lambda 2$ may be greater than a wavelength gap g2 between the first wavelength $\lambda 1$ and the seventh wavelength $\lambda 7$. Likewise, a wavelength gap between the second wavelength $\lambda 2$ and the third wavelength $\lambda 3$ may be nearly the same as the wavelength gap g3 between the first wavelength $\lambda 1$ and the second wavelength $\lambda 2$, and may be greater than a wavelength gap between the second wavelength $\lambda 2$ and the fifth wavelength $\lambda 5$ and a wavelength gap between the second wavelength $\lambda 2$ and the eighth wavelength $\lambda 8$. For example, the wavelength gap g3 between the first wavelength $\lambda 2$ and the second wavelength $\lambda 2$ and the wavelength gap between the second wavelength $\lambda 2$ and the third wavelength $\lambda 3$ may be within a range of about 30 nm to about 300 nm, and the wavelength gap g1 between the first wavelength $\lambda 1$ and the fourth wavelength $\lambda 4$ may be within a range of about 10 nm to about 100 nm.

Figure 3A:
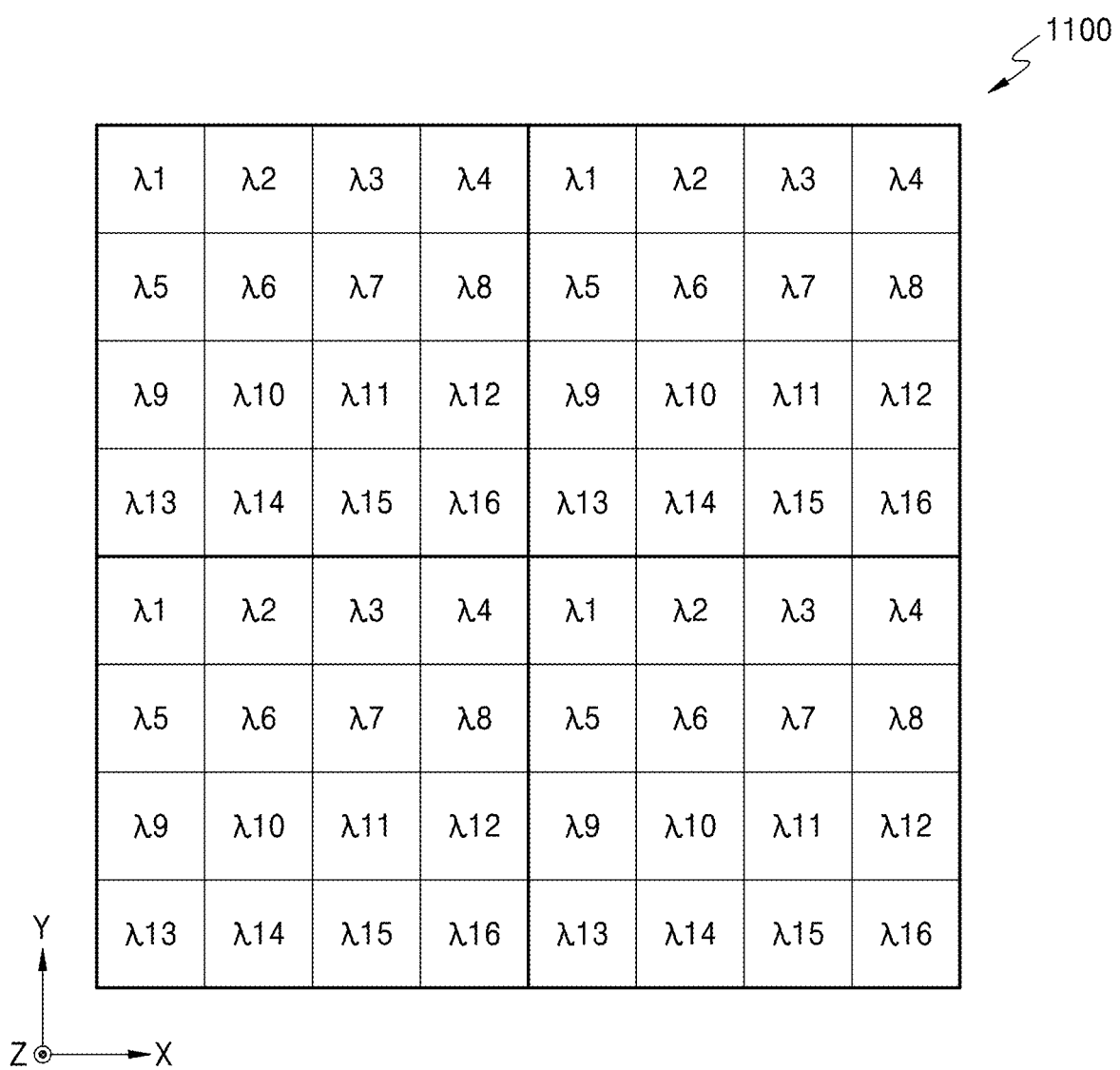
FIGS. 3A and 3B show examples of other various pixel arrangements in a pixel array of an image sensor.
Figure 3B:
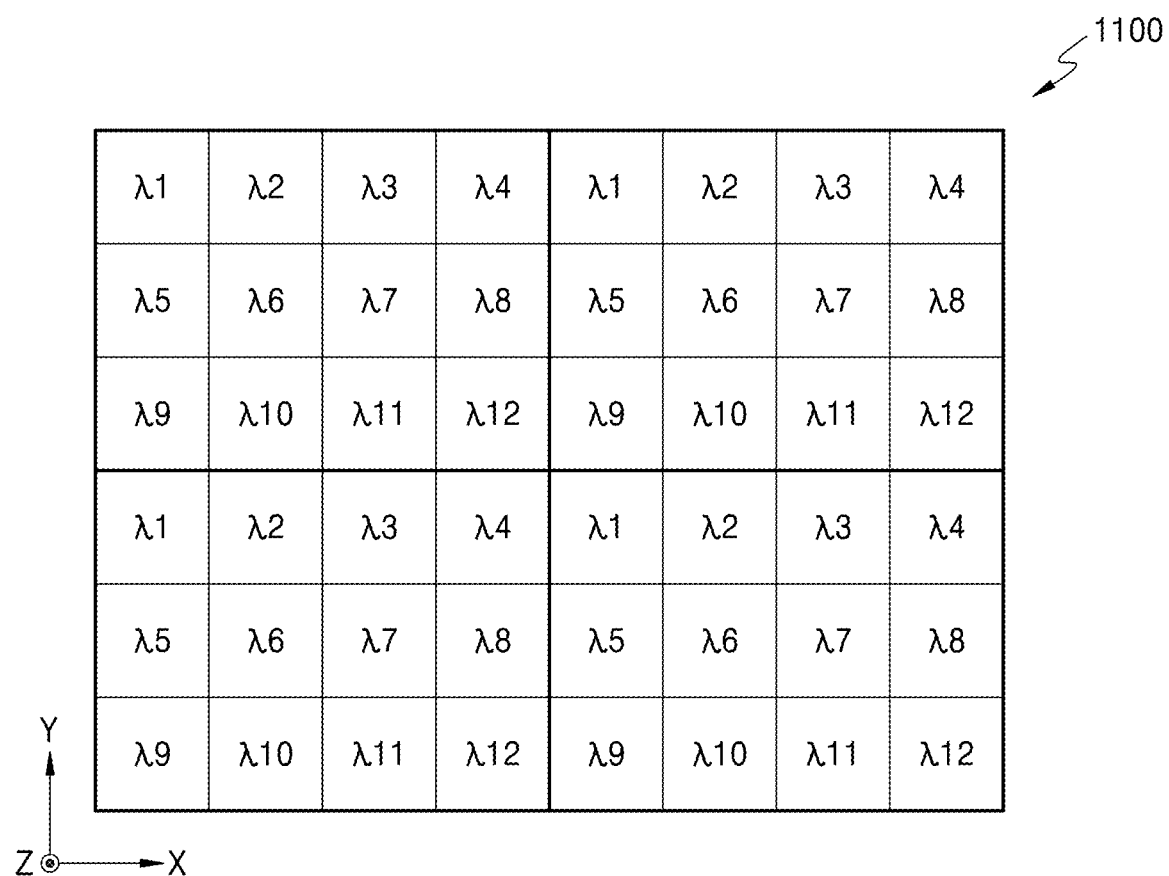

While it is described in FIGS. 2A and 2B that the pixel array 1100 has a unit pattern in a 3×3 array form, the disclosure is not limited thereto. FIGS. 3A and 3B show examples of other various pixel arrangements in a pixel array of an image sensor. Referring to FIG. 3A, the pixel array 1100 may have a unit pattern in a 4×4 array form. In this case, the unit pattern may include the first pixel that senses the light of the first wavelength λ1, the second pixel that senses the light of the second wavelength λ2, the third pixel that senses the light of the third wavelength λ3, the fourth pixel that senses the light of the fourth wavelength λ4, the fifth pixel that senses the light of the fifth wavelength λ5, the sixth pixel that senses the light of the sixth wavelength λ6, the seventh pixel that senses the light of the seventh wavelength λ7, the eighth pixel that senses the light of the eighth wavelength λ8, the ninth pixel that senses the light of the ninth wavelength λ9, a tenth pixel that senses light of a tenth wavelength λ10, an eleventh pixel that senses light of an eleventh wavelength λ11, a twelfth pixel that senses light of a twelfth wavelength λ12, a thirteenth pixel that senses light of a thirteenth wavelength λ13, a fourteenth pixel that senses light of a fourteenth wavelength λ14, a fifteenth pixel that senses light of a fifteenth wavelength λ15, and a sixteenth pixel that senses light of a sixteenth wavelength λ16. The first pixel, the second pixel, the third pixel, and the fourth pixel may be alternately arranged in the first direction (the X direction) in the first pixel row, the fifth pixel, the sixth pixel, the seventh pixel, and the eighth pixel may be alternately arranged in the first direction (the X direction) in the second pixel row that is adjacent to the first pixel row in the second direction (the Y direction), the ninth pixel, the tenth pixel, the eleventh pixel, and the twelfth pixel may be alternately arranged in the first direction (the X direction) in the third pixel row that is adjacent to the second pixel row in the second direction (the Y direction), and the thirteenth pixel, the fourteenth pixel, the fifteenth pixel, and the sixteenth pixel may be alternately arranged in the first direction (the X direction) in a fourth pixel row that is adjacent to the third pixel row in the second direction (the Y direction).

Referring to FIG. 3B, the pixel array 1100 may have a unit pattern in a 3×4 array form. In addition to the above examples, the pixel array 1100 may have various unit patterns in various forms according to the number of wavelengths for separation, but hereinbelow, for convenience, it will be described that the pixel array 1100 has a unit pattern in a 3×3 array form shown in FIG. 2A and a principle described below may also be applied to a pixel array having a unit pattern in other forms.

Figure 4A:
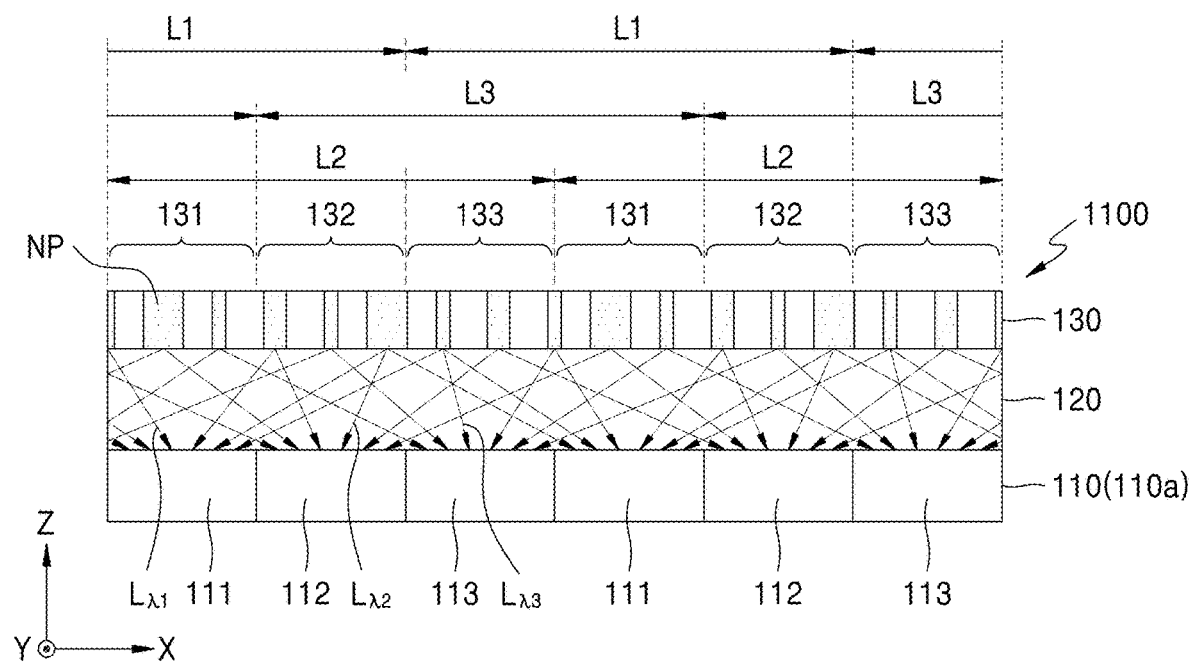
FIGS. 4A, 4B, 4C and 4D are schematically cross-sectional view showing other cross-sections of a pixel array of an image sensor according to an example embodiment.
Figure 4B:
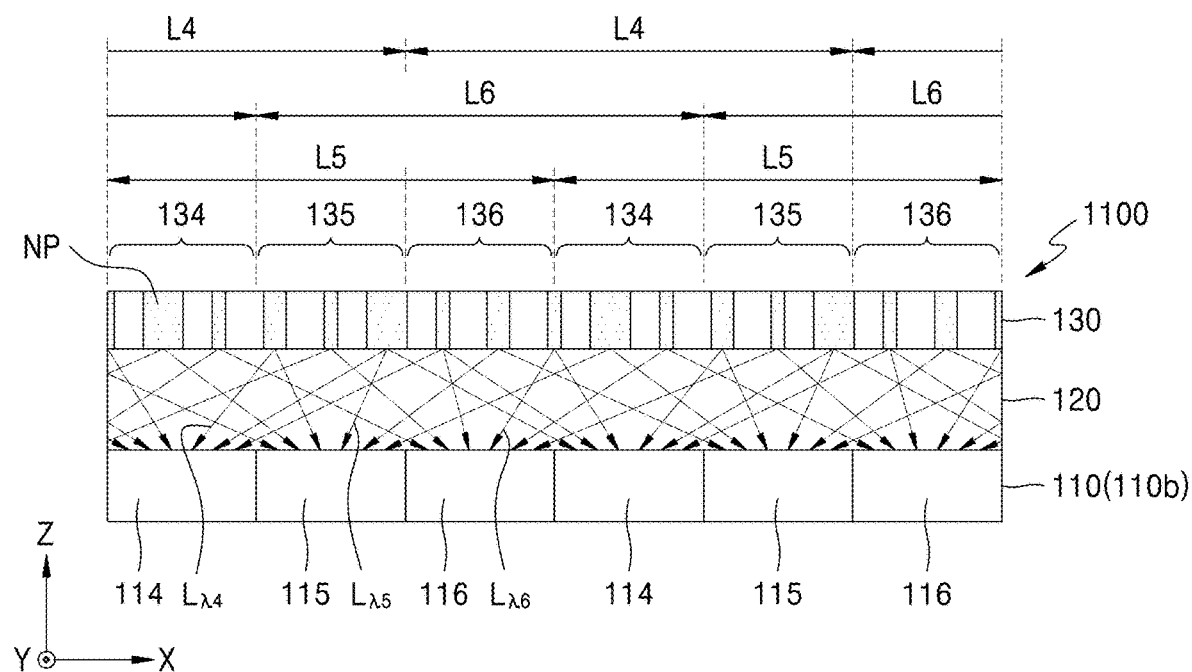
Figure 4C:
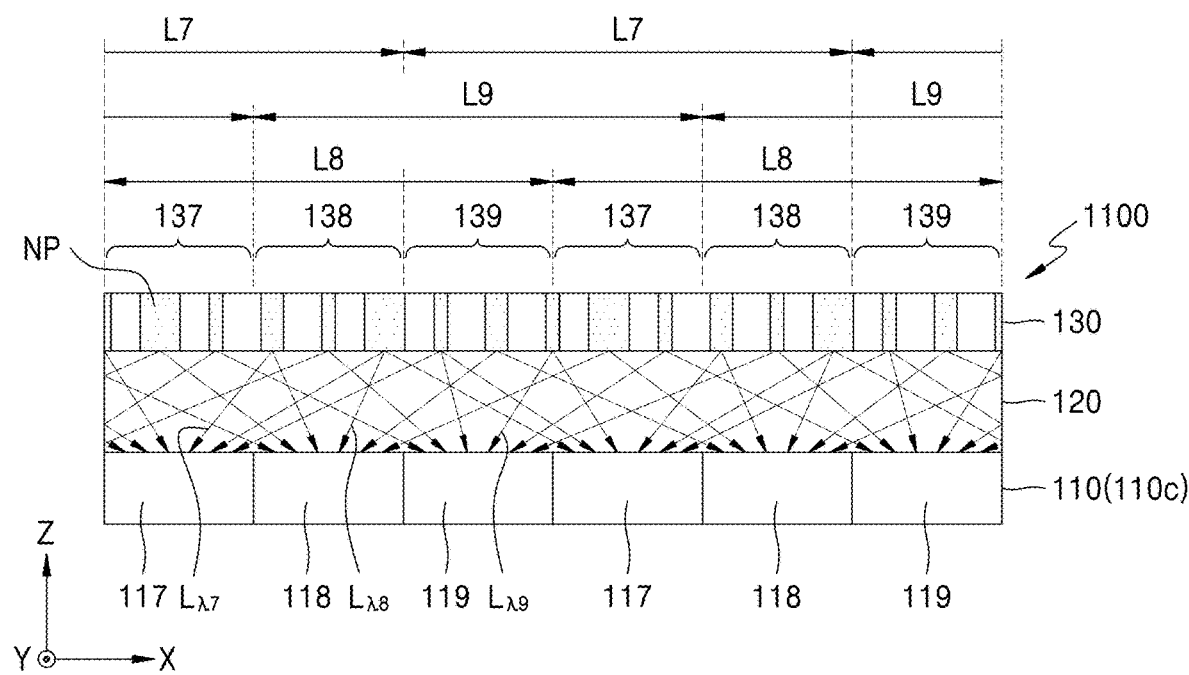
Figure 4D:
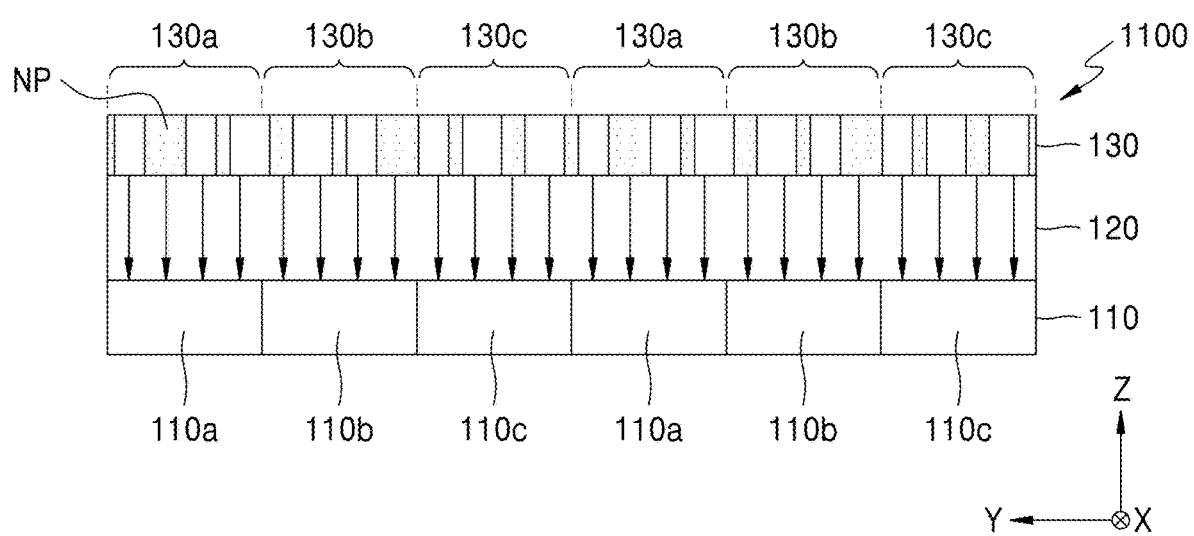

FIGS. 4A, 4B, 4C and 4D are schematic cross-sectional views showing different cross-sections of a pixel array of an image sensor, according to an example embodiment, in which FIG. 4A is a cross-sectional view taken along a line A-A' of FIG. 2A, FIG. 4B is a cross-sectional view taken along a line B-B' of FIG. 2A, FIG. 4C is a cross-sectional view taken along a line C-C' of FIG. 2A, and FIG. 4D is a cross-sectional view taken along a line D-D' of FIG. 2A.

Referring to FIGS. 4A, 4B and 4C, the pixel array 1100 of the image sensor 1000 may include a sensor substrate 110 including a plurality of pixels 111, 112, 113, 114, 115, 116, 117, 118, and 119 that sense light and convert the light into an electrical signal, a spacer layer 120 that is transparent and is provided on the sensor substrate 110, and a color separating lens array 130 provided on the spacer layer 120.

In the pixel array 1100 shown in FIG. 4A, a first pixel row 110a of the sensor substrate 110 may include the first pixel 111, the second pixel 112, and the third pixel 113 that are alternately arranged in the first direction (the X direction). A second pixel row 110b of the sensor substrate 110, which is adjacent to the first pixel row 110a in the second direction (the Y direction), may include the fourth pixel 114, the fifth pixel 115, and the sixth pixel 116 alternately arranged in the first direction (the X direction) as shown in FIG. 4B. A third pixel row 110c of the sensor substrate 110, which is adjacent to the second pixel row 110b in the second direction (the Y direction), may include the seventh pixel 117, the eighth pixel 118, and the ninth pixel 119 alternately arranged in the first direction (the X direction) as shown in FIG. 4C. According to an example embodiment, a separating film for pixel separation may be further provided in a boundary between pixels.

The color separating lens array 130 may include a plurality of nanostructures NP that change a phase of incident light differently according to an incidence location. The color separating lens array 130 may be partitioned in various ways. For example, the color separating lens array 130 may include a first pixel corresponding region 131 corresponding to the first pixel 111 of the sensor substrate 110, a second pixel corresponding region 132 corresponding to the second pixel 112, a third pixel corresponding region 133 corresponding to the third pixel 113, a fourth pixel corresponding region 134 corresponding to the fourth pixel region 114, a fifth pixel corresponding region 135 corresponding to the fifth pixel region 115, a sixth pixel corresponding region 136 corresponding to the sixth pixel region 116, a seventh pixel corresponding region 137 corresponding to the seventh pixel region 117, an eighth pixel corresponding region 138 corresponding to the eighth pixel 118, and a ninth pixel corresponding region 139 corresponding to the ninth pixel 119. The first through ninth pixel corresponding regions 131 through 139 may respectively include one or more nanostructures NP and may be provided to face the first through ninth pixels 111 through 119 corresponding thereto, respectively.

In another example, the color separating lens array 130 may be partitioned as a first wavelength light condensing region L1 that condenses first wavelength light $L_{\lambda 1}$ onto the first pixel 111, a second wavelength light condensing region L2 that condenses second wavelength light $L_{\lambda 2}$ onto the second pixel 112, a third wavelength light condensing region L3 that condenses third wavelength light $L_{\lambda 3}$ onto the third pixel 113, a fourth wavelength light condensing region L4 that condenses fourth wavelength light $L_{\lambda 4}$ onto the fourth pixel 114, a fifth wavelength light condensing region L5 that condenses fifth wavelength light $L_{\lambda 5}$ onto the fifth pixel 115, a sixth wavelength light condensing region L6 that condenses sixth wavelength light $L_{\lambda 6}$ onto the sixth pixel 116, a seventh wavelength light condensing region L7 that condenses seventh wavelength light $L_{\lambda 7}$ onto the seventh pixel 117, an eighth wavelength light condensing region L8 that condenses eighth wavelength light $L_{\lambda 8}$ onto the eighth pixel 118, and a ninth wavelength light condensing region L9 that condenses ninth wavelength light $L_{\lambda 9}$ onto the ninth pixel 119. The first wavelength light condensing region L1, the second wavelength light condensing region L2, and the third wavelength light condensing region L3, which face the first pixel row 110a shown in FIG. 4A, may partially overlap one another. The fourth wavelength light condensing region L4, the fifth wavelength light condensing region L5, and the sixth wavelength light condensing region L6, which face the second pixel row 110b shown in FIG. 4B, may partially overlap one another, and the seventh wavelength light condensing region L7, the eighth wavelength light condensing region L8, and the ninth wavelength light condensing region L9, which face the third pixel row 110c shown in FIG. 4C, may partially overlap one another. However, wavelength light condensing regions facing different pixel rows do not overlap each other. For example, the first through third wavelength light condensing regions L1 through L3 do not overlap the fourth through ninth wavelength light condensing regions L4 through L9.

Referring to FIG. 4A, the color separating lens array 130 may have different phase profiles respectively for the first wavelength light $L_{\lambda 1}$, the second wavelength light $L_{\lambda 2}$, and the third wavelength light $L_{\lambda 3}$ included in incident light to condense the first wavelength light $L_{\lambda 1}$ onto the first pixel 111, the second wavelength light $L_{\lambda 2}$ onto the second pixel 112, and the third wavelength light $L_{\lambda 3}$ onto the third pixel 113. Referring to FIG. 4B, the color separating lens array 130 may have different phase profiles respectively for the fourth wavelength light $L_{\lambda 4}$, the fifth wavelength light $L_{\lambda 5}$, and the sixth wavelength light $L_{\lambda 6}$ included in the incident light to condense the fourth wavelength light $L_{\lambda 4}$ onto the fourth pixel 114, the fifth wavelength light $L_{\lambda 5}$ onto the fifth pixel 115, and the sixth wavelength light $L_{\lambda 6}$ onto the sixth pixel 116. Referring to FIG. 4C, the color separating lens array 130 may have different phase profiles respectively for the seventh wavelength light $L_{\lambda 7}$, the eighth wavelength light $L_{\lambda 8}$, and the ninth wavelength light $L_{\lambda 9}$ included in the incident light to condense the seventh wavelength light $L_{\lambda 7}$ onto the seventh pixel 117, the eighth wavelength light $L_{\lambda 8}$ onto the eighth pixel 118, and the ninth wavelength light $L\lambda 9$ onto the ninth pixel 119.

For example, at a position immediately after passing through the color separating lens array 130, e.g., on a lower surface of the color separating lens array 130, the first wavelength light $L_{\lambda 1}$ having passed through the color separating lens array 130 may have a phase profile that is maximum at a center of the first pixel corresponding region 131 and decreases away from the center of the first pixel corresponding region 131 in the first direction (X direction). Such a phase profile may be similar to a phase profile of light converging to one point after passing through a micro-lens having a convex center in the first wavelength light condensing region L1, and the first wavelength light $L_{\lambda 1}$ may be condensed onto the first pixel 111. Likewise, at a position immediately after passing through the color separating lens array 130, the second through ninth wavelength lights $L_{\lambda 2}$ through $L_{\lambda 9}$ may respectively have the maximum phase profile at a center of second through ninth pixel corresponding regions 132 through 139, and thus may be respectively condensed onto the second through ninth pixels 112 through 119.

The color separating lens array 130 may include nanostructures NP that are arranged according to a certain rule such that the first through third wavelength light Lid through $L_{\lambda 3}$ may respectively have different phase profiles in the first pixel row 110a, the fourth through sixth wavelengths light $L_{\lambda 4}$ through $L_{\lambda 6}$ may respectively have different phase profiles in the second pixel row 110b, and the seventh through ninth wavelength light $L_{\lambda 7}$ through $L_{\lambda 9}$ may respectively have different phase profiles in the third pixel row 110c. Herein, the rule may be applied to parameters, such as the shape and sizes (width and height) of the nanostructure NP, a gap between the nanostructures NP, the arrangement form of the nanostructures NP, etc., and these parameters may be determined according to a phase profile to be implemented by the color separating lens array 130. The rules according to which the nanostructures NP are arranged in the first through ninth pixel corresponding regions 131 through 139 are different from one another. That is, the sizes, shapes, gaps, and/or arrangements of the nanostructures NP provided in the first through ninth pixel corresponding regions 131 through 139 may be different from one another.

A cross-sectional width or length of the nanostructures NP may have a sub-wavelength dimension. Herein, the sub-wavelength may refer to a wavelength that is less than a wavelength band of light to be branched. The nanostructures NP may have a dimension that is less than the shortest wavelength among the first through ninth wavelengths. For example, the cross-sectional width or length of the nanostructures NP may have a dimension that is less than 400 nm, 300 nm, or 200 nm. A height of the nanostructures NP may be about 500 nm to about 1500 nm, which is greater than the cross-sectional width or length. According to an example embodiment, the nanostructures NP may be obtained by combining two or more posts stacked in a third direction (Z direction). A thickness of the color separating lens array 130 in the third direction (Z direction) may be similar to the height of the nanostructures NP, and may be about 500 nm to about 1500 nm.

The nanostructures NP may include a material having a higher refractive index than that of a peripheral material. For example, the nanostructures NP may include c-Si, p-Si, a-Si and a Group III-V compound semiconductor (GaP, GaN, GaAs etc.), SiC, $TiO_2$, SiN, and/or a combination thereof. The nanostructures NP having a different refractive index from the refractive index of the peripheral material may change the phase of light that passes through the nanostructures NP. This is caused by a phase delay that occurs due to the shape dimension of the sub wavelength of the nanostructures NP, and a degree at which the phase is delayed may be determined by a detailed shape dimension and an arrangement shape of the nanostructures NP, etc. A peripheral material of the nanostructures NP may include a dielectric material having a lower refractive index than that of the nanostructures NP. For example, the peripheral material may include $SiO_2$ or air.

The color separating lens array 130 may be configured such that energy exchange occurs within the same row and does not occur between different rows. For example, the first wavelength light $L_{\lambda 1}$ incident on the second pixel corresponding region 132 of the color separating lens array 130, which faces the second pixel 112, in the first pixel row 110a may be condensed onto the first pixel 111 through the color separating lens array 130. However, the first wavelength light Lid incident on the fourth pixel corresponding region 134 of the color separating lens array 130, which faces the fourth pixel 114, in the second pixel row 110b may not be condensed onto the first pixel 111. Thus, wavelength light condensing regions that face the same pixel row may overlap each other, but wavelength light condensing regions that face different pixel rows may not overlap each other.

Referring to FIG. 4D, the color separating lens array 130 may include a first color separating lens array 130a extending in the first direction (X direction) to face the first pixel row 110a, a second color separating lens array 130b extending in the first direction (X direction) to face the second pixel row 110b, and a third color separating lens array 130c extending in the first direction (X direction) to face the third pixel row 110c. The first color separating lens array 130a, the second color separating lens array 130b, and the third color separating lens array 130c may be adjacent to one another in the second direction (Y direction).

The first color separating lens array 130a, the second color separating lens array 130b, and the third color separating lens array 130c may be configured to separate light of a plurality of wavelengths within different spectral ranges.

For example, the first color separating lens array 130a may separate the first through third wavelength light Lλ1 through Lλ3 within a first spectral range and condense them onto the first through third pixels 111, 112, and 113, respectively, the second color separating lens array 130b may separate the fourth through sixth wavelength light Lλ4 through Lλ6 within a second spectral range and condense them onto the fourth through sixth pixels 114, 115, and 116, respectively, and the third color separating lens array 130c may separate the seventh through ninth wavelength light Lλ7 through Lλ9 within a third spectral range and condense them onto the seventh through ninth pixels 117, 118, and 119, respectively.

The first spectral range, the second spectral range, and the third spectral range may partially overlap one another. For example, as shown in FIG. 2C, the fourth wavelength λ4 and the seventh wavelength λ7 may be located between the first wavelength λ1 and the fourth wavelength λ4, and the fifth wavelength λ5 and the eighth wavelength λ8 may be located between the second wavelength λ2 and the third wavelength λ3, and the third wavelength λ3 and the sixth wavelength λ6 may be located between the eighth wavelength λ8 and the ninth wavelength λ9. A wavelength gap between a plurality of wavelengths within the first, second, and third spectral ranges, separated by the first color separating lens array 130a, the second color separating lens array 130b, and the third color separating lens array 130c, respectively, may be sufficiently large. For example, a wavelength gap between the first wavelength λ1 and the second wavelength λ2 and a wavelength gap between the second wavelength λ2 and the third wavelength λ3 may be within a range of about 30 nm to about 300 nm. A wavelength gap of light condensed onto a directly adjacent pixel row in the second direction (the Y direction) may be relatively small. For example, a wavelength gap between the first wavelength λ1 and the fourth wavelength λ4 may be in a range of about 10 nm to about 100 nm, which is less than the wavelength gap between the first wavelength λ1 and the second wavelength λ2.

As shown in FIG. 4D, energy exchange does not occur among the first color separating lens array 130a, the second color separating lens array 130b, and the third color separating lens array 130c that are arranged to face one another in different pixel rows, such that light incident on the first color separating lens array 130a may travel to the first pixel row 110a of the sensor substrate 110. Light incident on the second color separating lens array 130b may travel to the second pixel row 110b, and light incident on the third color separating lens array 130c may travel to the third pixel row 110c. In this sense, the first color separating lens array 130a, the second color separating lens array 130b, and the third color separating lens array 130c may work independently of one another.

Meanwhile, the spacer layer 120 may be arranged between the sensor substrate 110 and the color separating lens array 130 to maintain a distance between the sensor substrate 110 and the color separating lens array 130 constant. The spacer layer 120 may include a transparent dielectric material to light of a wavelength band sensed by the image sensor 1000. The spacer layer 120 may also include a dielectric material having a lower refractive index than that of the color separating lens array 130. For example, the spacer layer 120 may include $SiO_2$, siloxane-based spin on glass (SOG), etc. A thickness of the spacer layer 120 may be determined based on a focal distance of the light condensed by the color separating lens array 130. For example, a focal distance of the color separating lens array 130 with respect to a center wavelength of the wavelength band sensed by the image sensor 1000 may be determined by the thickness of the spacer layer 120.

Figure 5A:
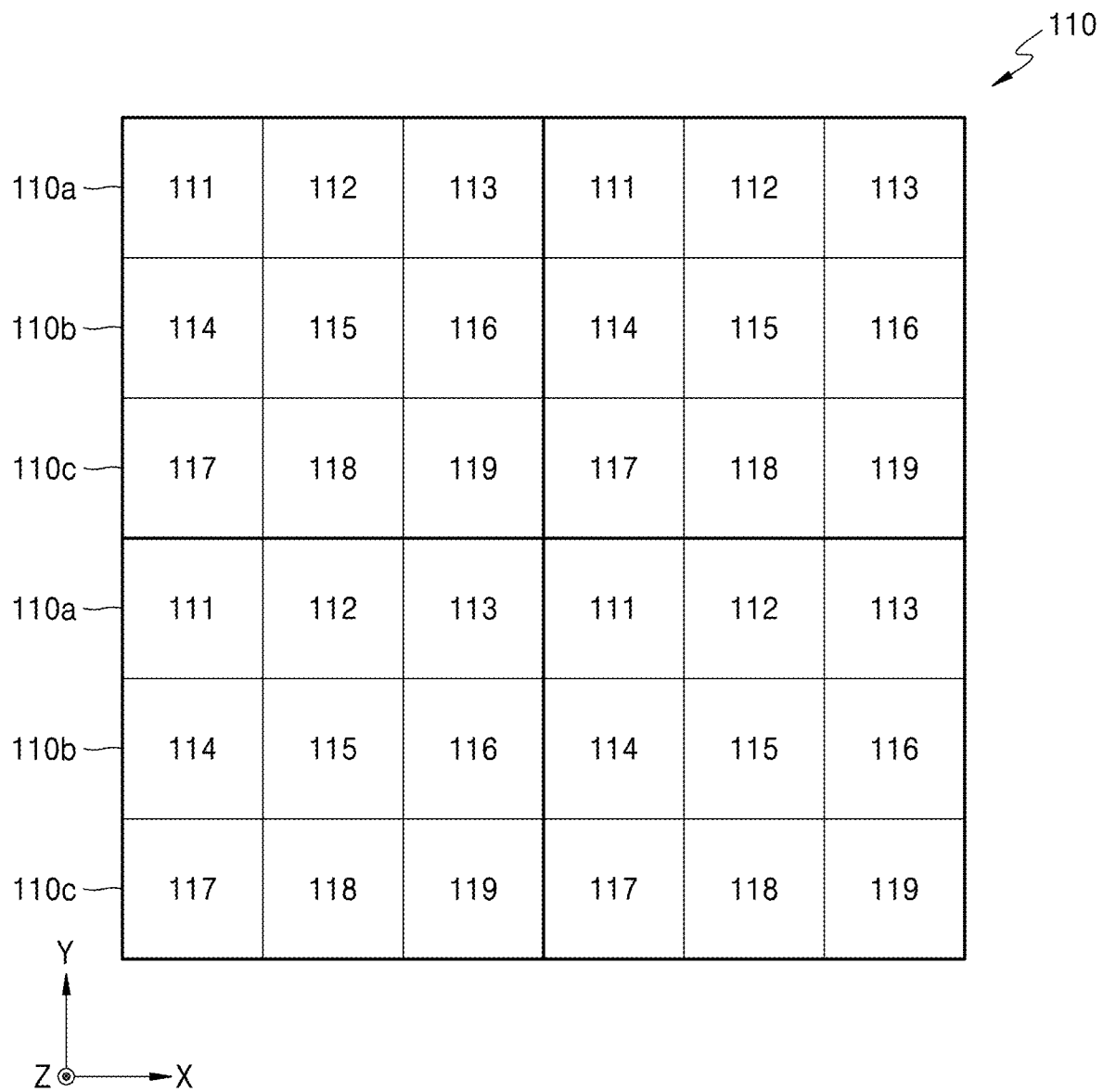
FIG. 5A is a plane view schematically showing a pixel arrangement of a sensor substrate.
Figure 5B:
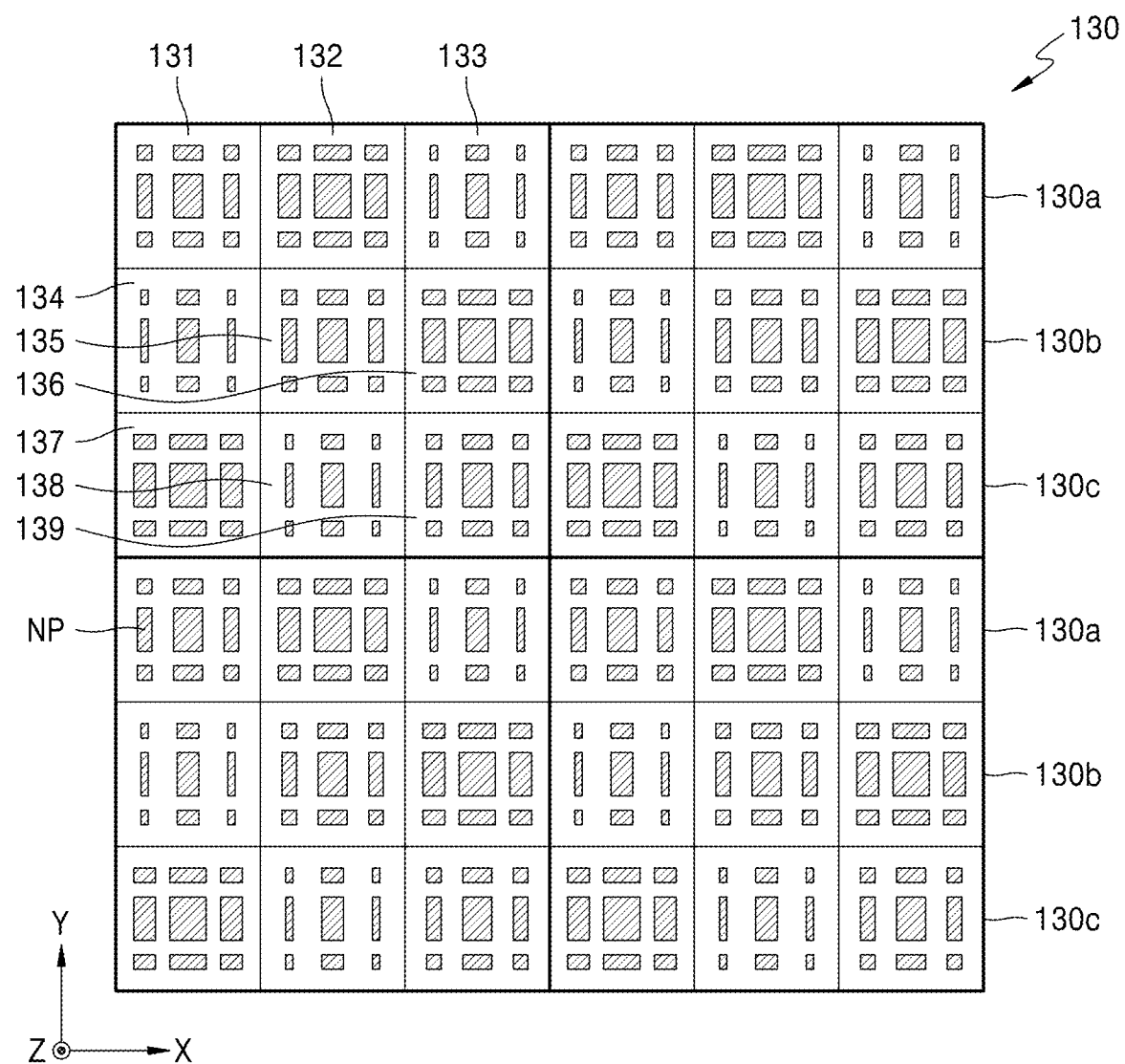
FIGS. 5B, 5C and 5D are plane views showing examples of a form in which a plurality of nanostructures are arranged in a plurality of regions of a color separating lens array.
Figure 5C:
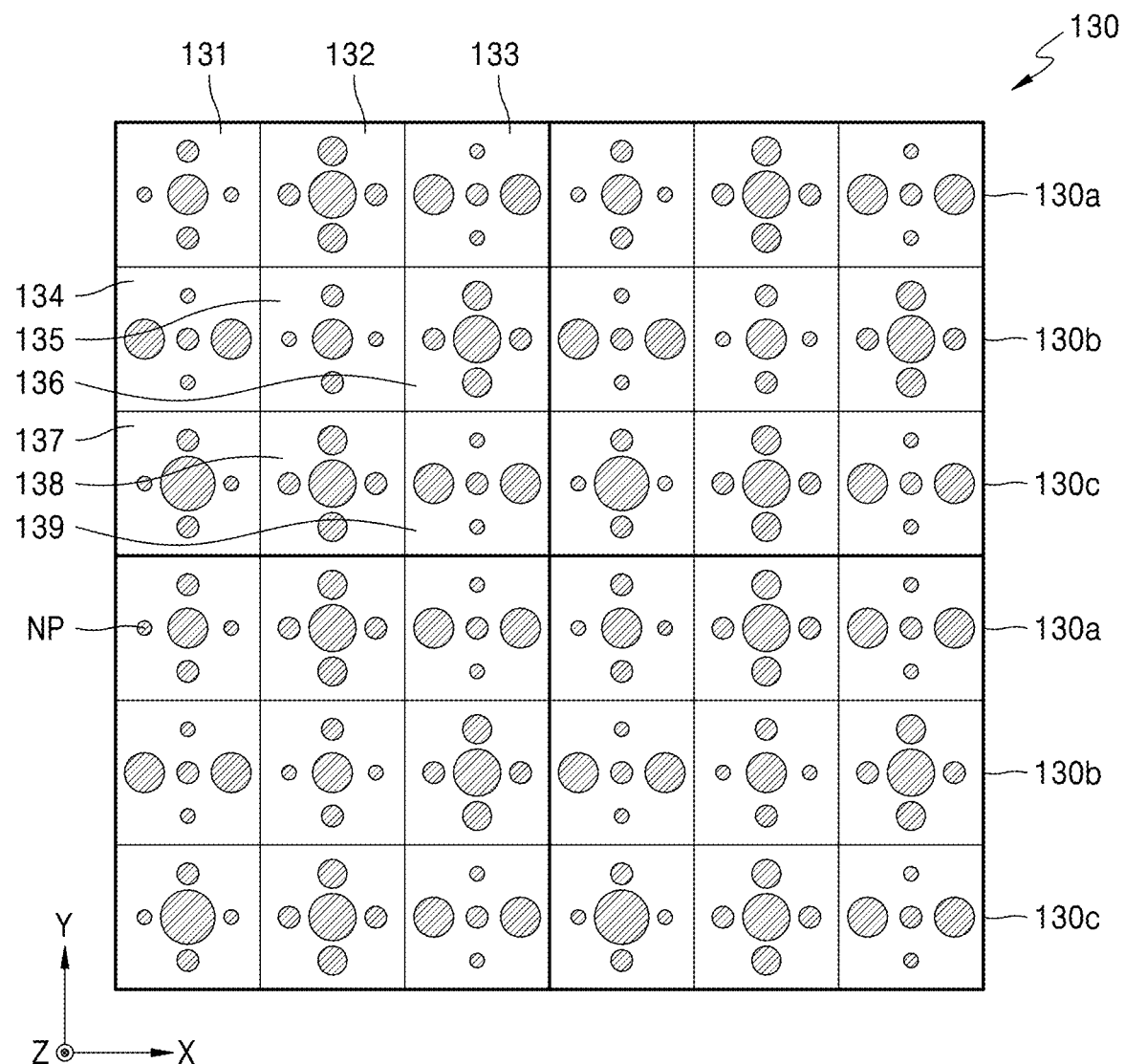
Figure 5D:
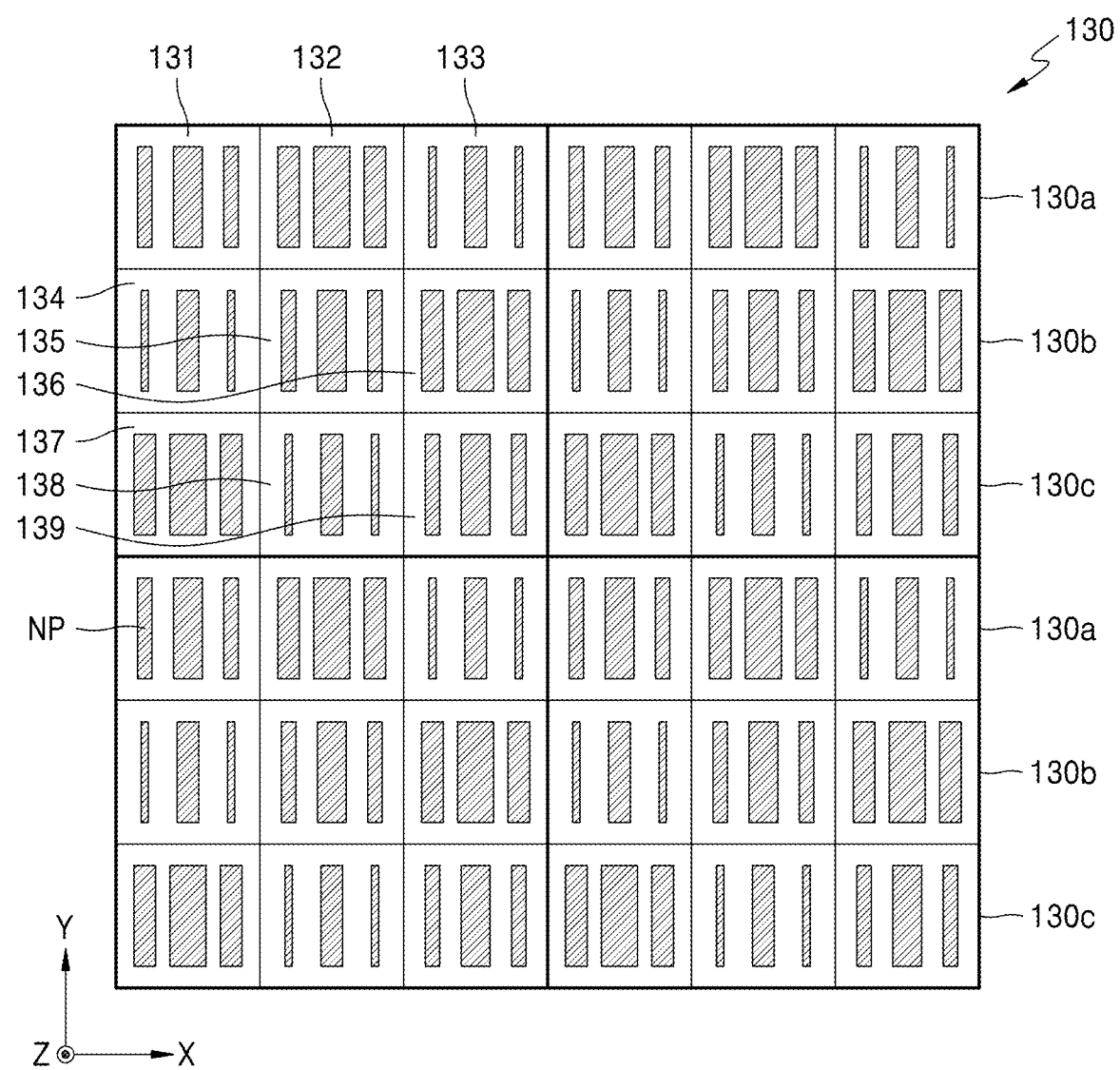

FIG. 5A is a plane view schematically showing a pixel arrangement of a sensor substrate, and FIGS. 5B, 5C and 5D are plane views showing examples of a form in which a plurality of nanostructures are arranged in a plurality of regions of a color separating lens array.

Referring to FIG. 5A, the sensor substrate 110 may include the first pixel row 110a, the second pixel row 110b, and the third pixel row 110c that are alternately arranged in the second direction (the Y direction). The first pixel row 110a may include the first pixel 111, the second pixel 112, and the third pixel 113 alternately arranged in the first direction (the X direction), the second pixel row 110b may include the fourth pixel 114, the fifth pixel 115, and the sixth pixel 116 alternately arranged in the first direction (the X direction), and the third pixel row 110c may include the seventh pixel 117, the eighth pixel 118, and the ninth pixel 119 alternately arranged in the first direction (the X direction). The first to ninth pixels 111 to 119 form a unit pattern in the form of a 3×3 array.

Referring to FIG. 5B, the color separating lens array 130 may include the first color separating lens array 130a extending in the first direction (the X direction) to vertically face the first pixel row 110a of the sensor substrate 110, the second color separating lens array 130b extending in the first direction (the X direction) to vertically face the second pixel row 110b, and the third color separating lens array 130c extending in the first direction (the X direction) to vertically face the third pixel row 110c. In addition, the color separating lens array 130 may be partitioned into the first to ninth pixel corresponding regions 131 to 139 respectively corresponding to the first to ninth pixels 111 to 119 of the sensor substrate 110. The first to ninth pixel corresponding regions 131 to 139 may be arranged to vertically face the first to ninth pixels 111 to 119 of the sensor substrate 110 respectively corresponding thereto. The first color separating lens array 130a may include a plurality of first to third pixel corresponding regions 131 to 133 alternately arranged in the first direction (the X direction), the second color separating lens array 130b may include a plurality of fourth through sixth pixel corresponding regions 134 to 136 alternately arranged in the first direction (the X direction), and the third color separating lens array 130c may include a plurality of seventh through ninth pixel corresponding regions 137 to 139 alternately arranged in the first direction (the X direction). The first to third color separating lens arrays 130a, 130b, and 130c may be alternately arranged in the second direction (the Y direction). On the other hand, as shown in FIGS. 4A, 4B and 4C, the color separating lens array 130 may be partitioned into the first to ninth wavelength condensing regions L1 to L9.

The first color separating lens array 130a may include the nanostructures NP with a size, a shape, a gap, and/or arrangement that are determined such that out of incident light incident on the first color separating lens array 130a, first wavelength light is branched and condensed onto the first pixel 111, second wavelength light is branched and condensed onto the second pixel 112, and third light is branched and condensed onto the third pixel 113. The second color separating lens array 130b may include the nanostructures NP with a size, a shape, a gap, and/or arrangement that are determined such that out of incident light incident on the second color separating lens array 130b, fourth wavelength light is branched and condensed onto the fourth pixel 114, fifth wavelength light is branched and condensed onto the fifth pixel 115, and sixth light is branched and condensed onto the sixth pixel 116, and the third color separating lens array 130c may include the nanostructures NP with a size, a shape, a gap, and/or arrangement that are determined such that out of incident light incident on the third color separating lens array 130c, seventh wavelength light is branched and condensed onto the seventh pixel 117, eighth wavelength light is branched and condensed onto the eighth pixel 118, and ninth light is branched and condensed onto the ninth pixel 119.

For example, referring to FIG. 5B, each of the first through ninth pixel corresponding regions 131 to 139 may include nine nanostructures NP in the form of nanoposts having a rectangular cross-section. The nine nanostructures NP in one pixel corresponding region may be arranged in the form of a 3×3 array. A first-direction (X-direction) dimension and a second-direction (Y-direction) dimension of the nanostructures NP may change with a position of the nanostructures NP in each pixel corresponding region, and may be symmetric to each other in the first direction (the X direction) and the second direction (the Y direction). For example, the second-direction (Y-direction) dimension of the nanostructures NP arranged in a first row and a third row among three rows of the nanostructures NP arranged in each pixel corresponding region may be equal to each other, and the first-direction (X-direction) dimension of the nanostructures NP arranged in a first column and a third column among three columns of the nanostructures NP may be equal to each other.

In addition, the first-direction (X-direction) dimension and the second-direction (Y-direction) dimension of the nanostructures NP may change with the first to ninth pixel corresponding regions 131 to 139. For example, the first-direction (X-direction) dimension of nine nanostructures NP arranged in the first pixel corresponding region 131 of the first color separating lens array 110a may be less than the first-direction (X-direction) dimension of nine corresponding nanostructures NP arranged in the second pixel corresponding region 132, and the first-direction (X-direction) dimension of the nine nanostructures NP arranged in the third pixel corresponding region 133 may be less than the first-direction (X-direction) dimension of the nine corresponding nanostructures NP arranged in the first pixel corresponding region 131. The second-direction (Y-direction) dimension of the nanostructures NP arranged in the same row in all pixel corresponding regions 131, 132, 133 of the first color separating lens array 110a may be equal. For example, the second-direction (Y-direction) dimension of the nanostructures NP arranged in the first row among the three rows of the nanostructures NP arranged in the first color separating lens array 110a may be equal, the second-direction (Y-direction) dimension of the nanostructures NP arranged in the second row may be equal, and the second-direction (Y-direction) dimension of the nanostructures NP arranged in the third row may be equal.

The first-direction (X-direction) dimension and the second-direction (Y-direction) dimension of the nanostructures NP arranged in the first through third pixel corresponding regions 131, 132, 133 of the first color separating lens array 110a may be less than the shortest wavelength among the first through third wavelengths. The first-direction (X-direction) dimension and the second-direction (Y-direction) dimension of the nanostructures NP arranged in the fourth through sixth pixel corresponding regions 134, 135, and 136 of the second color separating lens array 110b may be less than the shortest wavelength among the fourth through sixth wavelengths, and the first-direction (X-direction) dimension and the second-direction (Y-direction) dimension of the nanostructures NP arranged in the seventh through ninth pixel corresponding regions 137, 138, and 139 of the third color separating lens array 110c may be less than the shortest wavelength among the seventh through ninth wavelengths.

The nanostructures NP are illustrated to have a rectangular cross-section in FIG. 5B, but the cross-section of the nanostructures NP is not limited thereto. Referring to FIG. 5C, the nanostructures NP may have a circular cross-section. Although it is shown in FIG. 5C as an example that a total of five nanostructures NP are arranged in each pixel corresponding region at a center thereof and between four sides of the pixel corresponding region and the center thereof, the number of nanostructures NP arranged in each pixel corresponding region is not limited thereto. A diameter of the nanostructures NP may change with a position of the nanostructures NP in each pixel corresponding region, and may vary according to the first through ninth pixel corresponding regions 131 to 139 where the nanostructures NP are arranged. A diameter of the nanostructures NP arranged in the first color separating lens array 110a may be less than the shortest wavelength among the first through third wavelengths, a diameter of the nanostructures NP arranged in the second color separating lens array 110b may be less than the shortest wavelength among the fourth through sixth wavelengths, and a diameter of the nanostructures NP arranged in the third color separating lens array 110c may be less than the shortest wavelength among the seventh through ninth wavelengths.

Referring to FIG. 5D, the nanostructures NP may have a cross-sectional shape in the form of a stripe extending in the second direction (the Y direction). While it is shown in FIG. 5D as an example that four nanostructures NP are arranged in each pixel corresponding region, the number of nanostructures NP arranged in each pixel corresponding region is not necessarily limited thereto. The first-direction (X-direction) dimension of the nanostructures NP and a first-direction (X-direction) gap between the nanostructures NP may change with a position of the nanostructures NP in each pixel corresponding region, and may vary with the first through ninth pixel corresponding regions 131 to 139 where the nanostructures NP are arranged. FIG. 5D shows that nanostructures NP are separated from adjacent another nanostructure NP in the first direction (the X direction), but a second-direction (Y-direction) end portion of some nanostructures NP may be connected to an end portion of adjacent another nanostructure NP in the first direction (the X direction). Positions of two adjacent nanostructures NP having respective end portions connected to each other may change with the first through ninth pixel corresponding regions 131 to 139.

FIGS. 5B, 5C and 5D show possible arrangements of the nanostructures NP in the color separating lens array 130, and various shapes and arrangements of the nanostructures NP may be possible in addition to illustration of FIGS. 5B through 5D. When a rule regarding a phase profile of light having passed through the color separating lens array 130 described above is satisfied, arrangements of the nanostructures NP of any form may be applied.

Figure 6A:
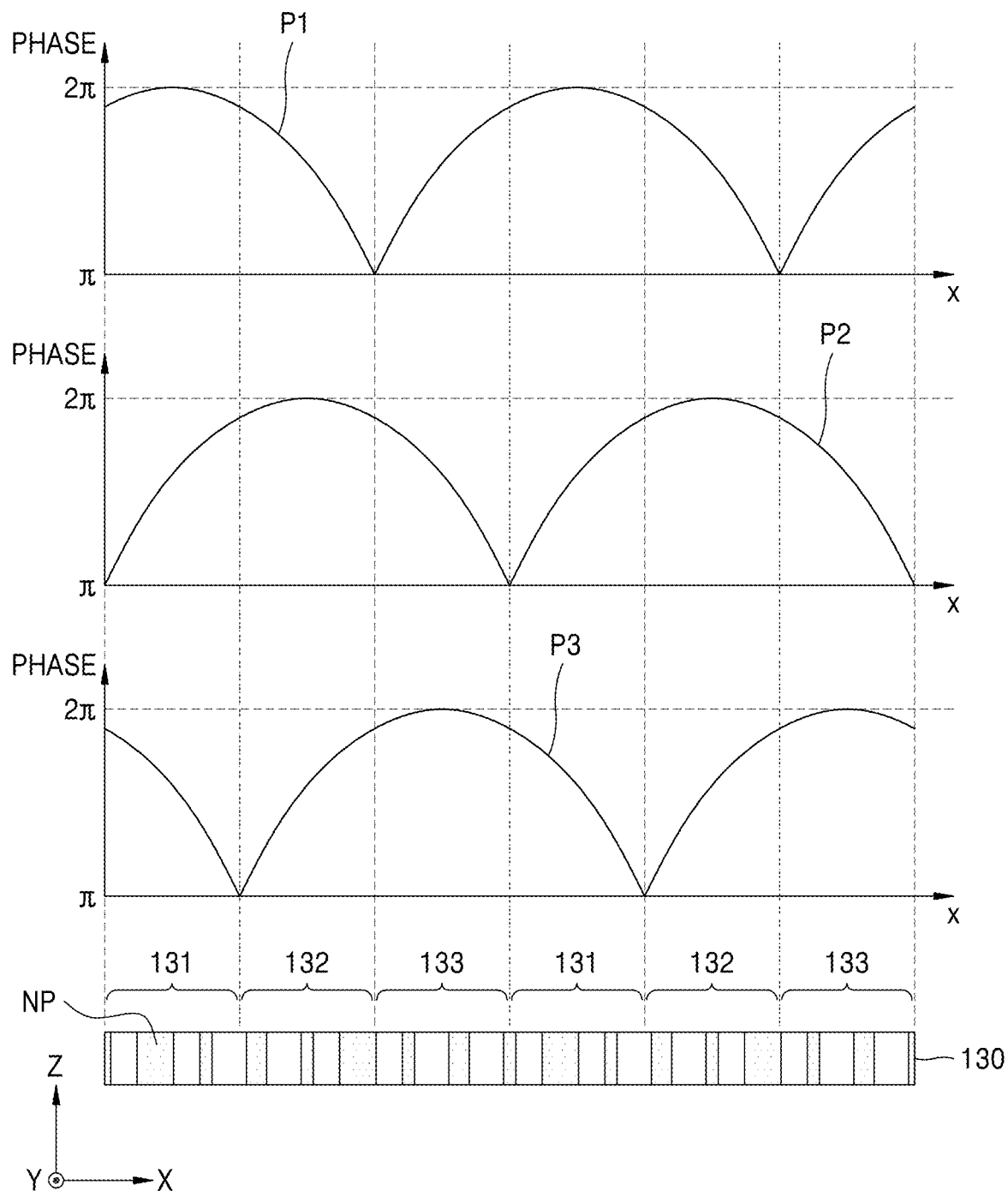
FIG. 6A is a graph showing an example of a phase profile of light of first through third wavelengths having passed through a first color separating lens array.
Figure 6B:
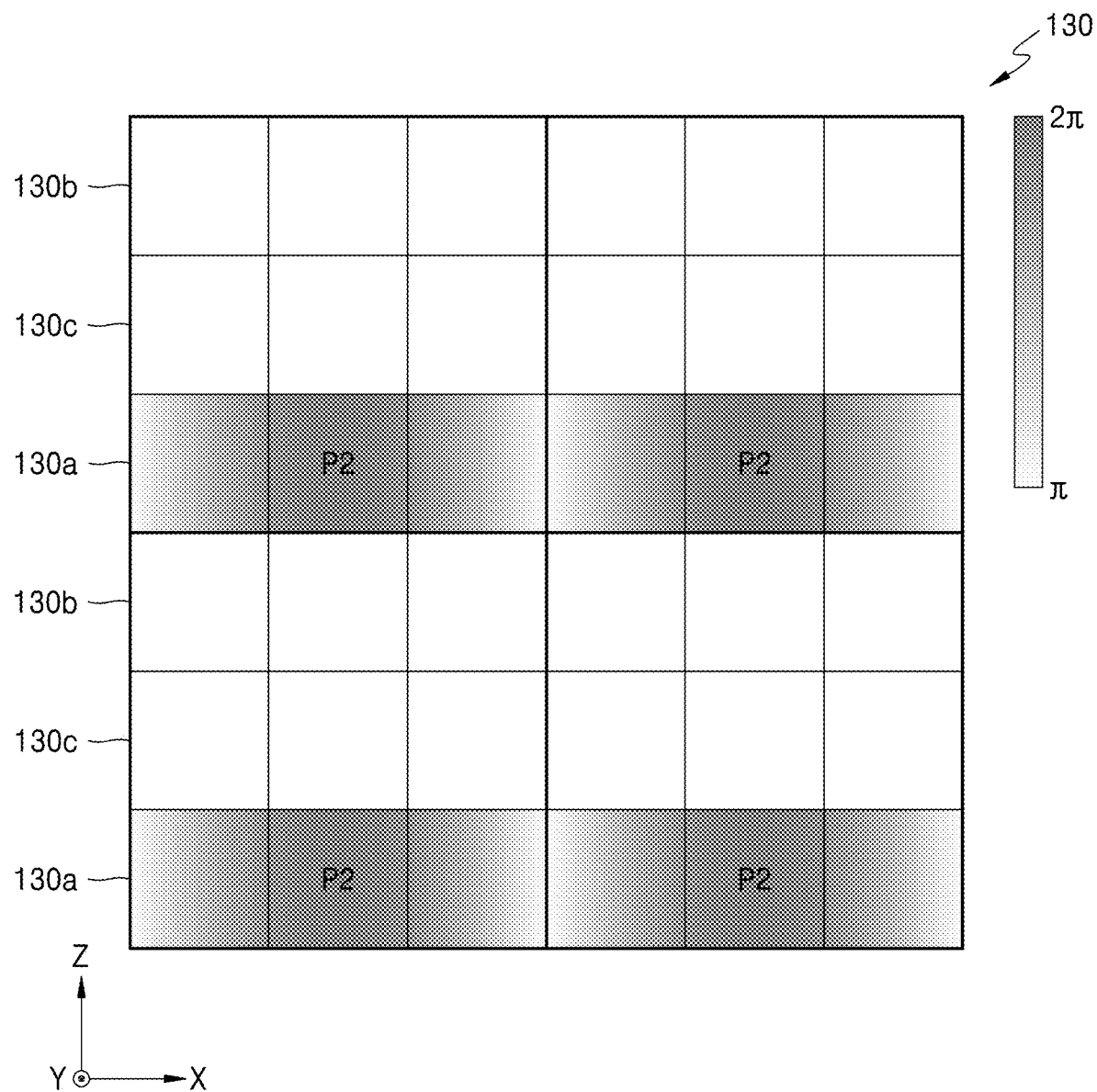
FIG. 6B is a plane view showing an example of a phase profile of light of a second wavelength having passed through the first color separating lens array on a color separating lens array.
Figure 6C:
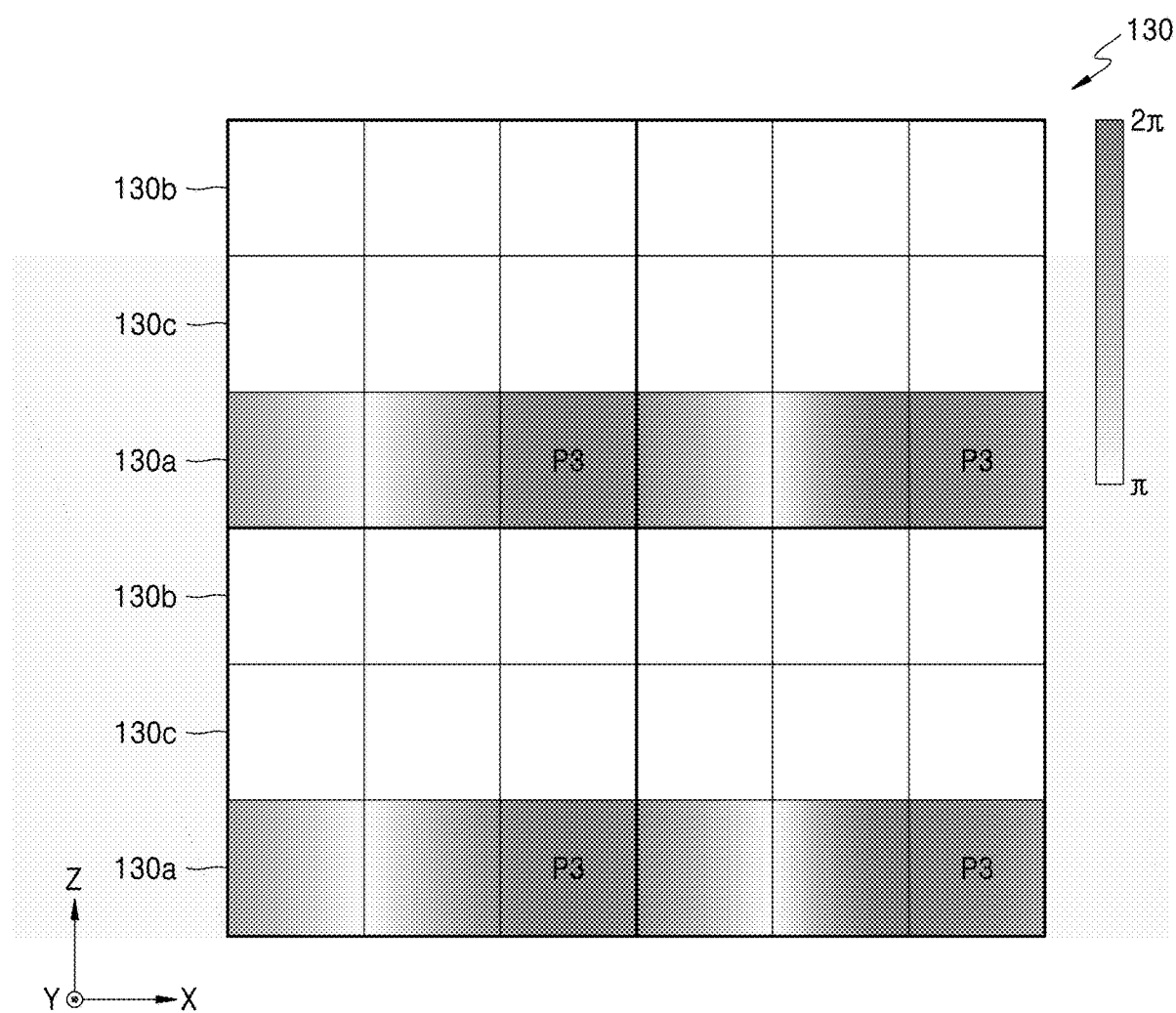
FIG. 6C is a plane view showing an example of a phase profile of light of a third wavelength having passed through the first color separating lens array on the color separating lens array.
Figure 6D:
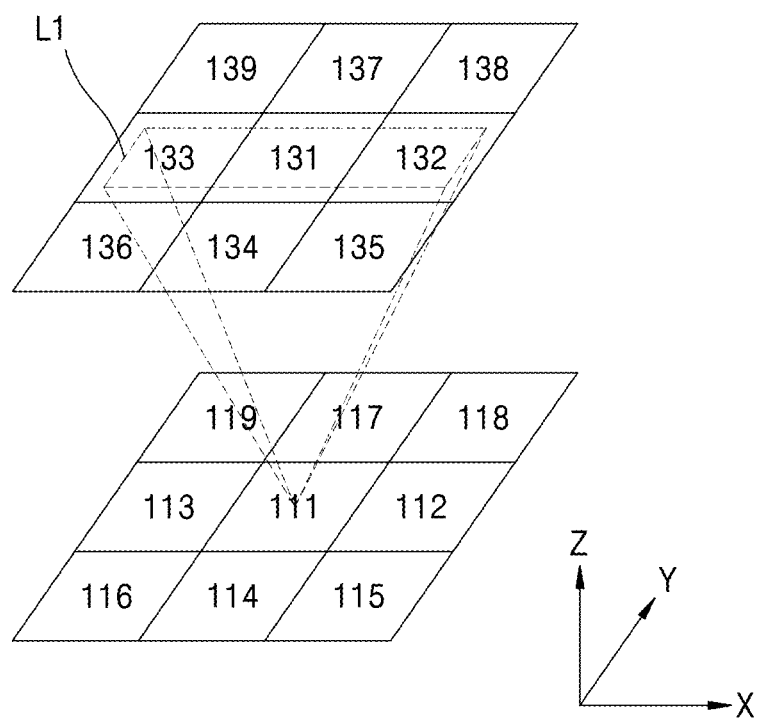
FIG. 6D shows an example of a traveling direction of the light of the first wavelength incident on a first wavelength light condensing region.

FIG. 6A is a graph showing an example of a phase profile of first through third wavelength light having passed through the first color separating lens array 130a, FIG. 6B is a plane view showing an example of a phase profile of second wavelength light having passed through the first color separating lens array 130a on the color separating lens array 130, FIG. 6C is a plane view showing an example of a phase profile of third wavelength light having passed through the first color separating lens array 130a on the color separating lens array 130, and FIG. 6D shows an example of a traveling direction of the first wavelength light incident on the first wavelength light condensing region 131.

Referring to FIG. 6A, the first wavelength light having passed through the first color separating lens array 130a may have a first phase profile P1 that is maximum at a center of the first pixel corresponding region 131 and reduces away from the center in the first direction (the X direction). More specifically, at a position immediately after passing through the first color separating lens array 130a, e.g., on a lower surface of the first color separating lens array 130a and an upper surface of the spacer layer 120, a phase of the first wavelength light is maximum at the center of the first pixel corresponding region 131 and decreases away from the center of the first pixel corresponding region 131 in the first direction (the X direction), thus being minimum in a boundary between the second pixel corresponding region 132 and the third pixel corresponding region 133. For example, when the phase of the first wavelength light output from the center of the first pixel corresponding region 131 is set to $2\pi$, the phase of the first wavelength light in the boundary between the second pixel corresponding region 132 and the third pixel corresponding region 133 may be about $0.9\pi$ to about $1.1\pi$.

Meanwhile, the first phase profile P1 does not mean that a phase delay amount of the first wavelength light having passed through the center of the first pixel corresponding region 131 is maximum, and when the phase of the first wavelength light having passed through the first pixel corresponding region 131 is set to $2\pi$ and the phase of the first wavelength light having passed through another position has a value greater than $2\pi$ due to a greater phase delay, then the first phase profile P1 may have a value remaining after removal by $2n\pi$, e.g., may be a profile of a wrapped phase. For example, for the phase of the first wavelength light having passed through the first pixel corresponding region 131 being $2\pi$, when the phase of light having passed through the boundary between the second pixel corresponding region 132 and the third pixel corresponding region 133 is $3\lambda$, the phase in the boundary between the second pixel corresponding region 132 and the third pixel corresponding region 133 may be $\pi$ remaining after removing about $2\pi$ (n=1) from about $3\pi$.

The second wavelength light having passed through the first color separating lens array 130a may have a second phase profile P2 that is maximum at a center of the second pixel corresponding region 132 and decreases away from the center of the second pixel corresponding region 132 in the first direction (the X direction). At a position immediately after passing through the first color separating lens array 130a, the phase of the second wavelength light may be maximum at a center of the second pixel corresponding region 132 and decreases away from the center of the second pixel corresponding region 132 in the first direction (the X direction), thus being minimum in a boundary between the third pixel corresponding region 133 and the first pixel corresponding region 131. For example, when the phase of the second wavelength light output from the center of the second pixel corresponding region 132 is set to $2\pi$, the phase of the second wavelength light in the boundary between the third pixel corresponding region 133 and the first pixel corresponding region 131 may be about $0.9\pi$ to about $1.1\pi$.

The third wavelength light having passed through the first color separating lens array 130a may have a third phase profile P3 that is maximum at a center of the third pixel corresponding region 133 and decreases away from the center in the first direction (the X direction). At a position immediately after passing through the first color separating lens array 130a, the phase of the third wavelength light may be maximum at a center of the third pixel corresponding region 133 and decreases away from the center of the third pixel corresponding region 133 in the first direction (the X direction), thus being minimum in a boundary between the first pixel corresponding region 131 and the second pixel corresponding region 132. For example, when the phase of the third wavelength light output from the center of the third pixel corresponding region 133 is set to $2\pi$, the phase of the third wavelength light in the boundary between the first pixel corresponding region 131 and the second pixel corresponding region 132 may be about $0.9\pi$ to about $1.1\pi$.

As described above, the color separating lens array 130 may be configured such that energy exchange occurs within the same row and does not occur between different rows. In other words, energy exchange does not occur among the first to third color separating lens arrays 130a, 130b, and 130c. Thus, light output from the first color separating lens array 130a after being incident on the first color separating lens array 130a may be distributed in the first through third pixel corresponding regions 131, 132, and 133 and may not be distributed in pixel corresponding regions of the second and third color separating lens arrays 130b and 130c. Referring to FIGS. 6B and 6C, the phases of the second wavelength light and the third wavelength light having passed through the first color separating lens array 130a may increase or decrease in the first to third pixel corresponding regions 131 to 133, and may not be distributed in the second and third color separating lens arrays 130b and 130c that are adjacent in the second direction (the Y direction). According to an example embodiment, the phase of the first wavelength light having passed through the first color separating lens array 130a may increase or decrease in the first to third pixel corresponding regions 131 to 133, and may not be distributed in the second and third color separating lens arrays 130b and 130c that are adjacent in the second direction (the Y direction). As a result, the light output from the first color separating lens array 130a after being incident on the first color separating lens array 130a may be condensed onto the first to third pixels 111 to 113 in the first pixel row corresponding to the first color separating lens array 130a, and may not be condensed onto the fourth to ninth pixels 114 to 119 in the second and third pixel rows corresponding to the second and third color separating lens arrays 130b and 130c.

Referring to FIG. 6D, the first wavelength light may be condensed onto the first pixel 111 by the color separating lens array 130. The first wavelength light coming from the first to third pixel corresponding regions 131 to 133 of the color separating lens array 130 may be incident on the first pixel 111. The first phase profile P1 of the first wavelength light described above may cause the first wavelength light having passed through the first wavelength light condensing region L1 including the first pixel corresponding region 131 and the second pixel and third pixel corresponding regions 132 and 133 at both sides of the first pixel corresponding region 131 to be condensed onto the first pixel 111. Thus, the color separating lens array 130 may operate for the first wavelength light as an array of a plurality of first wavelength light condensing regions L1 that are arranged in the first direction (the X direction) to condense the first wavelength light. The first wavelength light condensing region L1 may have an area that is greater than that of the corresponding first pixel 111. For example, the area of the first wavelength light condensing region L1 may be about 2.5 times to about three times greater than that of the first pixel 111.

The color separating lens array 130 may operate for the second wavelength light as an array of a plurality of second wavelength light condensing regions L2 that are arranged in the first direction (the X direction) to condense the second wavelength light, and may operate for the third wavelength light as an array of a plurality of third wavelength light condensing regions L3 that are arranged in the first direction (the X direction) to condense the third wavelength light. As described above, the first wavelength light condensing region L1, the second wavelength light condensing area L2, and the third wavelength light condensing region L3 may partially overlap one another.

According to an example embodiment, a phase profile of the fourth through sixth wavelength light having passed through the second color separating lens array 130b and a phase profile of the seventh through ninth wavelength light having passed through the third color separating lens array 130c may follow the above-described principles. For example, the fourth wavelength light having passed through the second color separating lens array 130b may have a phase profile that is maximum at a center of the fourth pixel corresponding region 134 and decreases away from the center of the fourth pixel corresponding region 134 in the first direction (the X direction), thus being minimum in a boundary between the fifth pixel corresponding region 135 and the sixth pixel corresponding region 136. The fifth wavelength light having passed through the second color separating lens array 130b may have a phase profile that is maximum at a center of the fifth pixel corresponding region 135 and decreases away from the center of the fifth pixel corresponding region 135 in the first direction (the X direction), thus being minimum in a boundary between the sixth pixel corresponding region 136 and the fourth pixel corresponding region 134. The sixth wavelength light having passed through the second color separating lens array 130b may have a phase profile that is maximum at a center of the sixth pixel corresponding region 136 and decreases away from the center of the sixth pixel corresponding region 136 in the first direction (the X direction), thus being minimum in a boundary between the fourth pixel corresponding region 134 and the fifth pixel corresponding region 135.

The seventh wavelength light having passed through the third color separating lens array 130c may have a phase profile that is maximum at a center of the seventh pixel corresponding region 137 and decreases away from the center of the seventh pixel corresponding region 137 in the first direction (the X direction), thus being minimum in a boundary between the eighth pixel corresponding region 138 and the ninth pixel corresponding region 139. The eighth wavelength light having passed through the third color separating lens array 130c may have a phase profile that is maximum at a center of the eighth pixel corresponding region 138 and decreases away from the center of the eighth pixel corresponding region 138 in the first direction (the X direction), thus being minimum in a boundary between the ninth pixel corresponding region 139 and the seventh pixel corresponding region 137. The ninth wavelength light having passed through the third color separating lens array 130c may have a phase profile that is maximum at a center of the ninth pixel corresponding region 139 and decreases away from the center of the ninth pixel corresponding region 139 in the first direction (the X direction), thus being minimum in a boundary between the seventh pixel corresponding region 137 and the eighth pixel corresponding region 138.

The light output from the second color separating lens array 130b after being incident on the second color separating lens array 130b may be condensed onto the fourth through sixth pixels 114 to 116 in the second pixel row corresponding to the second color separating lens array 130b, and may not be condensed onto the first through third pixels 111 to 113 and the seventh through ninth pixels 117 to 119 in the first and third pixel rows corresponding to the first and third color separating lens arrays 130a and 130c. In addition, light output from the third color separating lens array 130c after being incident on the third color separating lens array 130c may be condensed onto the seventh to ninth pixels 117 to 119 in the third pixel row corresponding to the third color separating lens array 130c, and may not be condensed onto the first to sixth pixels 111 to 116 corresponding to the first and second color separating lens arrays 130a and 130b.

Figure 7A:
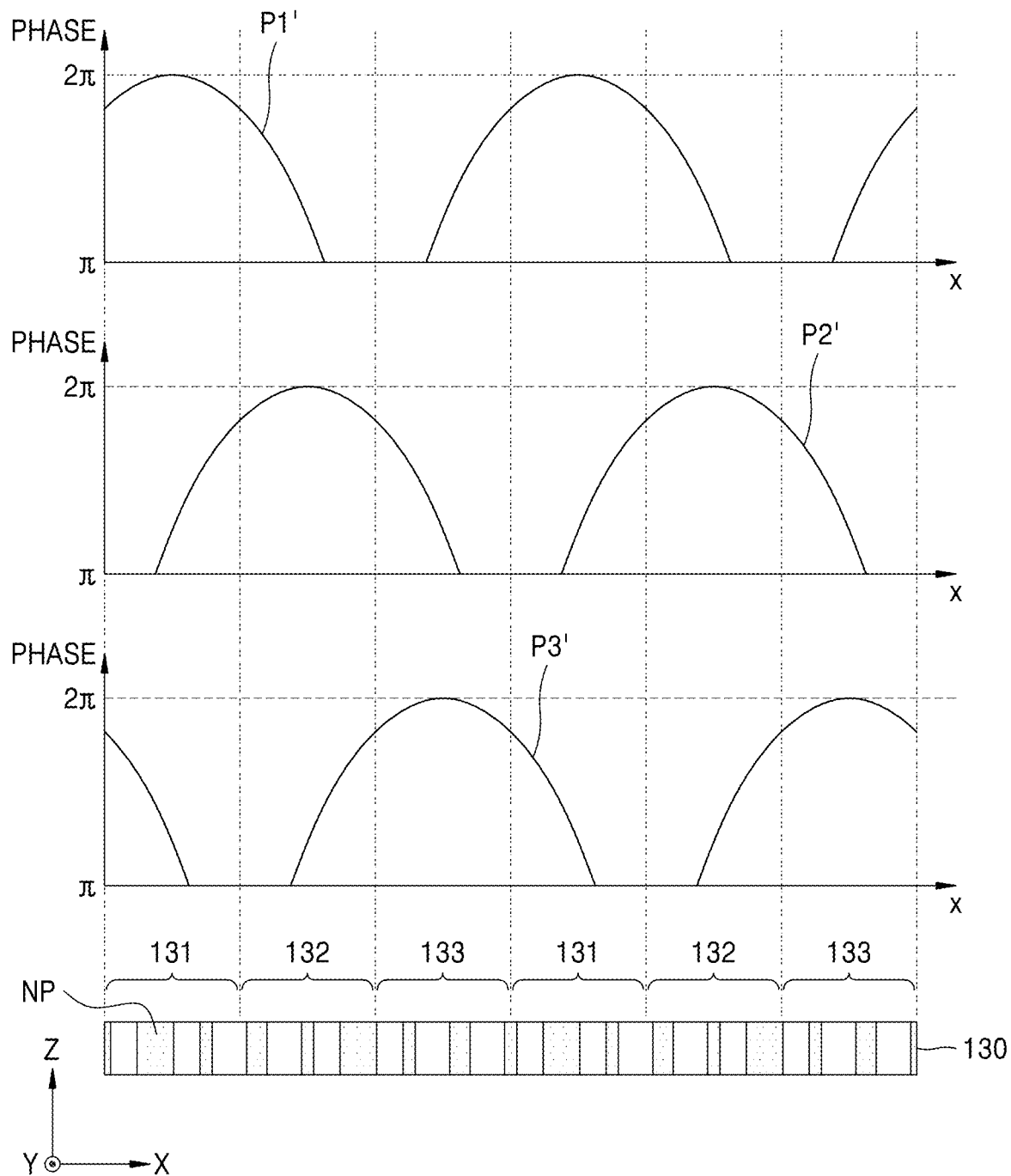
FIG. 7A is a graph showing another example of a phase profile of light of first through third wavelengths having passed through a first color separating lens array.
Figure 7B:
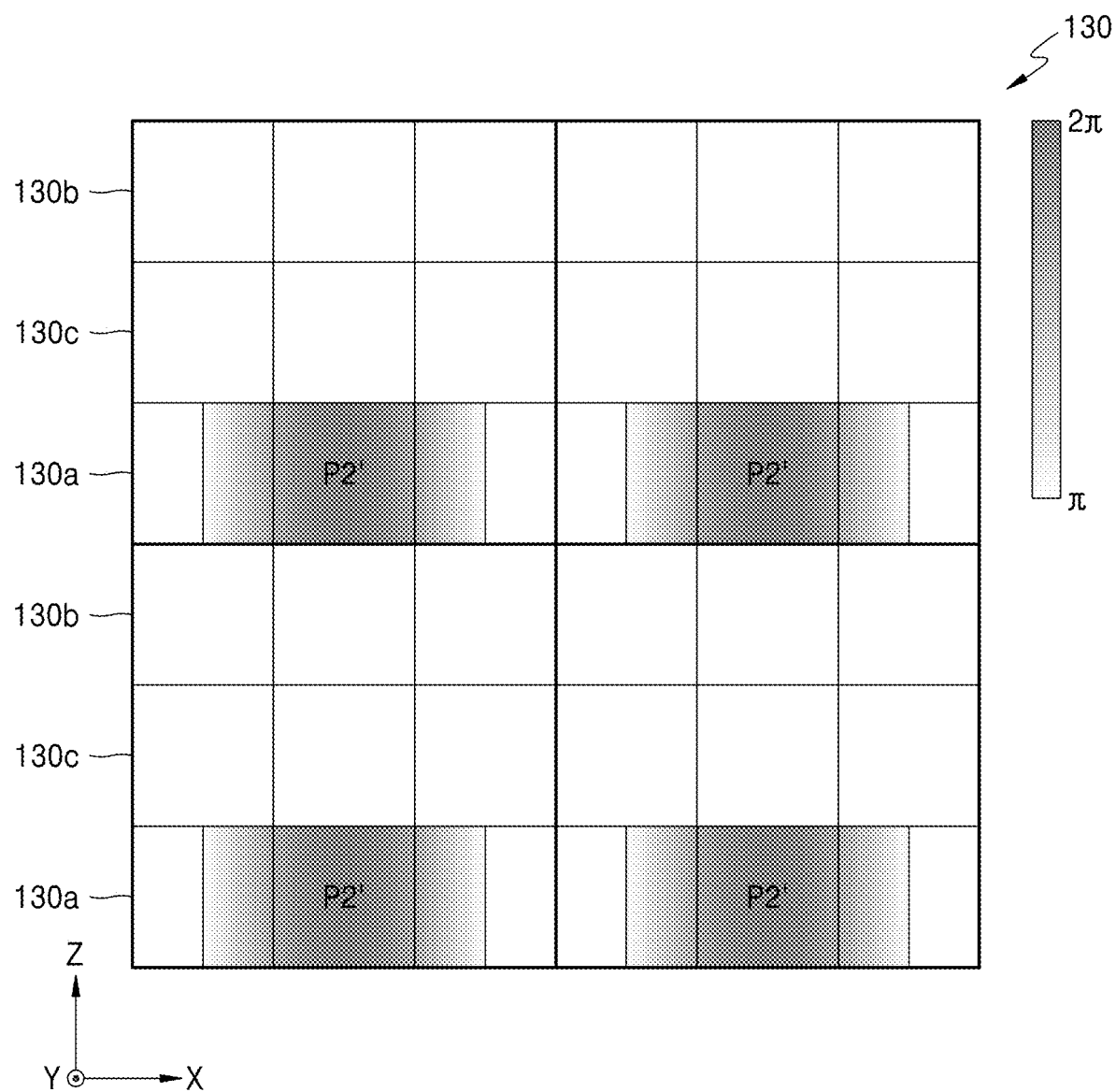
FIG. 7B is a plane view showing another example of a phase profile of light of a second wavelength having passed through the first color separating lens array on a color separating lens array.

FIG. 7A is a graph showing another example of a phase profile of first through third wavelength light having passed through the first color separating lens array 130a, and FIG. 7B is a plane view showing another example of a phase profile of second wavelength light having passed through the first color separating lens array 130a on the color separating lens array 130.

Referring to FIG. 7A, the first wavelength light having passed through the first color separating lens array 130a may have a phase profile P1' that is maximum at the center of the first pixel corresponding region 131 and decreases away from the center of the first pixel corresponding region 131 in the first direction (the X direction), thus being minimum at centers of the second pixel corresponding region 132 and the third pixel corresponding region 133 that are immediately adjacent to the first pixel corresponding region 131. For example, when the phase of the first wavelength light output from the center of the first pixel corresponding region 131 is set to $2\pi$, the phase of the first wavelength light at the centers of the second pixel corresponding region 132 and the third pixel corresponding region 133 may be about $0.9\pi$ to about $1.1\pi$. The first wavelength light may not be distributed in the boundary between the second pixel corresponding region 132 and the third pixel corresponding region 133. In this case, the area of the first wavelength condensing region L1 may be about 1.5 times to about 2 times greater than the area of the first pixel 111.

Referring to FIGS. 7A and 7B, the second wavelength light having passed through the first color separating lens array 130a may have a phase profile P2' that is maximum at the center of the second pixel corresponding region 132 and decreases away from the center of the second pixel corresponding region 132 in the first direction (the X direction), thus being minimum at the centers of the first pixel corresponding region 131 and the third pixel corresponding region 133 that are immediately adjacent to the second pixel corresponding region 132. For example, when the phase of the second wavelength light output from the center of the second pixel corresponding region 132 is set to $2\pi$, the phase of the first wavelength light at the centers of the first pixel corresponding region 131 and the third pixel corresponding region 133 may be about $0.9\pi$ to about $1.1\pi$. The second wavelength light may not be distributed in the boundary between the first pixel corresponding region 131 and the third pixel corresponding region 133.

The third wavelength light having passed through the first color separating lens array 130a may have a phase profile P3' that is maximum at the center of the third pixel corresponding region 133 and decreases away from the center of the third pixel corresponding region 133 in the first direction (the X direction), thus being minimum at the centers of the first pixel corresponding region 131 and the second pixel corresponding region 132 that are immediately adjacent to the third pixel corresponding region 133. For example, when the phase of the third wavelength light output from the center of the third pixel corresponding region 133 is set to 2 π, the phase of the first wavelength light at the centers of the first pixel corresponding region 131 and the second pixel corresponding region 132 may be about 0.9 π to about 1.1 π. The third wavelength light may not be distributed in the boundary between the first pixel corresponding region 131 and the second pixel corresponding region 132.

According to an example embodiment, the phase profile of the fourth through sixth wavelength light having passed through the second color separating lens array 130b and the phase profile of the seventh through ninth wavelength light having passed through the third color separating lens array 130c may be similar to the phase profile shown in FIGS. 7A and 7B. For example, the fourth wavelength light having passed through the second color separating lens array 130b may have a phase profile that is maximum at the center of the fourth pixel corresponding region 134 and decreases away from the center of the fourth pixel corresponding region 134 in the first direction (the X direction), thus being minimum at the centers of the fifth pixel corresponding region 135 and the sixth pixel corresponding region 136 that are immediately adjacent to the fourth pixel corresponding region 134. The seventh wavelength light having passed through the third color separating lens array 130c may have a phase profile that is maximum at the center of the seventh pixel corresponding region 137 and decreases away from the center of the seventh pixel corresponding region 137 in the first direction (the X direction), thus being minimum at the centers of the eighth pixel corresponding region 138 and the ninth pixel corresponding region 139 that are immediately adjacent to the seventh pixel corresponding region 137.

Figure 8:
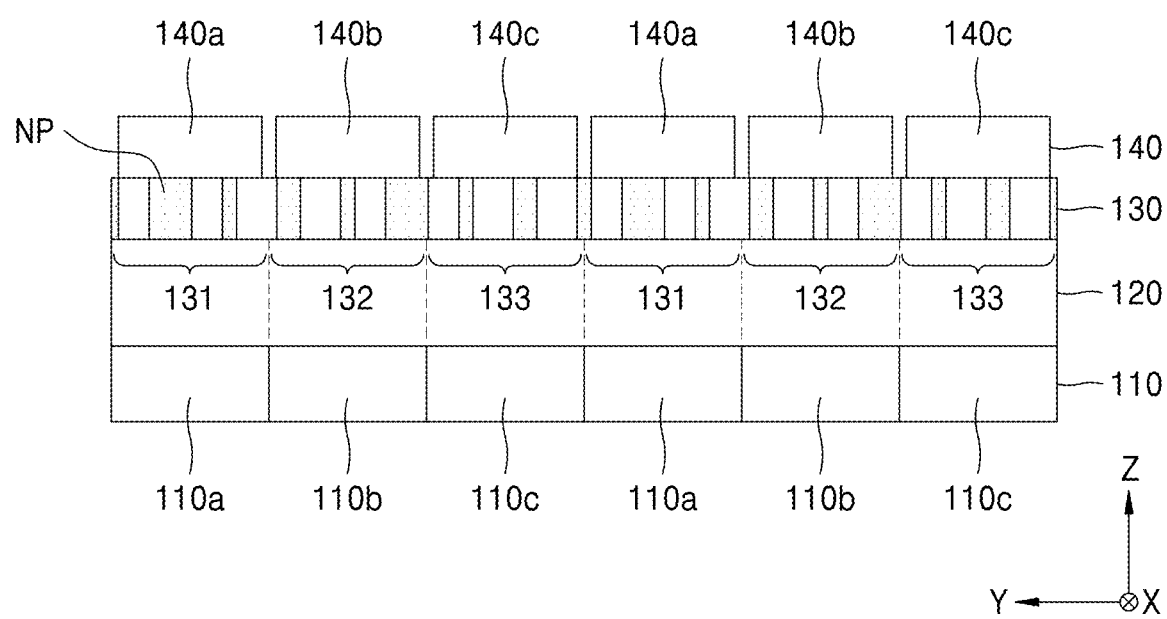
FIG. 8 is a schematic cross-sectional view showing a structure of a pixel array of an image sensor, according to another example embodiment.

FIG. 8 is a schematic cross-sectional view showing a structure of a pixel array of an image sensor, according to another example embodiment. For example, FIG. 8 may correspond to a cross-sectional view along a line D-D' of FIG. 2A. Referring to FIG. 8, the pixel array 1100 of the image sensor 1000 may further include an isolating layer 140 arranged on the color separating lens array 130. The isolating layer 140 may include a first transparent bar 140a extending in the first direction (the X direction) on the first color separating lens array 130a, a second transparent bar 140b extending in the first direction on the second color separating lens array 130b, and a third transparent bar 140c extending in the first direction on the third color separating lens array 130c. The first to third transparent bars 140a, 140b, and 140c may be completely separated from one another at intervals therebetween. The isolating layer 140 may more reliably prevent energy exchange among the first to third color separating lens arrays 130a, 130b, and 130c that are adjacent.

Figure 9:
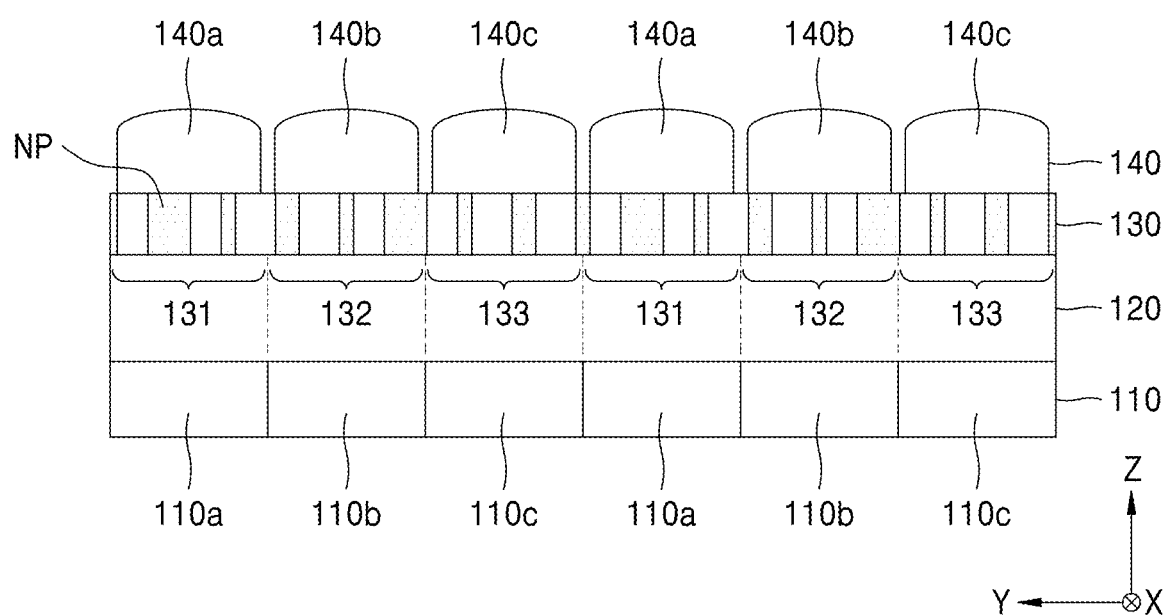
FIG. 9 is a schematic cross-sectional view showing a structure of a pixel array of an image sensor, according to another example embodiment.

FIG. 9 is a schematic cross-sectional view showing a structure of a pixel array of an image sensor, according to another example embodiment. For example, FIG. 9 may correspond to a cross-sectional view along the line D-D' of FIG. 2A. Referring to FIG. 9, upper surfaces of the first to third transparent bars 140a, 140b, and 140c may have a convex curved shape. Thus, the first to third transparent bars 140a, 140b and 140c may function as a cylinder lens having no refractive power in the first direction (the X direction) and having refractive power in the second direction (the Y direction). In this case, the first transparent bar 140a may condense light at the center of the first pixel row 110a in the second direction (the Y direction), and the second transparent bar 140b may condense light at the center of the second pixel row 110b in the second direction (the Y direction), and the third transparent bar 140c may condense light at the center of the third pixel row 110c in the second direction (the Y direction).

Figure 10:
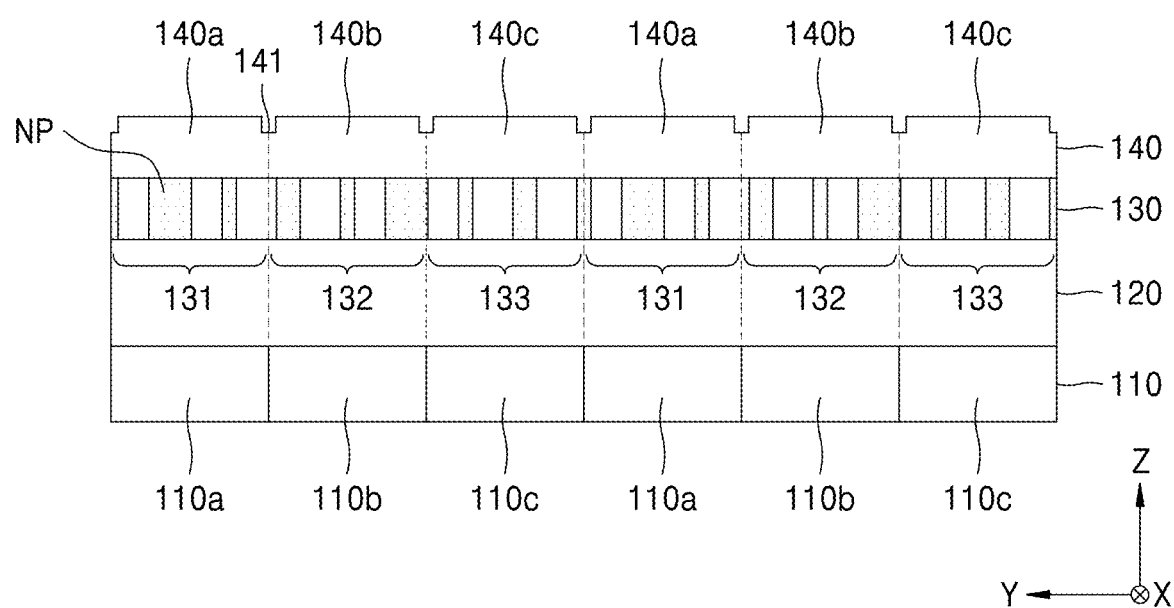
FIG. 10 is a schematic cross-sectional view showing a structure of a pixel array of an image sensor, according to another example embodiment.

FIG. 10 is a schematic cross-sectional view showing a structure of a pixel array of an image sensor, according to another example embodiment. For example, FIG. 10 may correspond to a cross-sectional view along the line D-D' of FIG. 2A. Referring to FIG. 10, the isolating layer 140 arranged on the color separating lens array 130 may have one transparent flat plate shape. To prevent energy exchange between the first to third color separating lens arrays 130a, 130b, and 130c., the isolating layer 140 may have a groove 141 concavely formed at an interface between the first and second color separating lens arrays 130a and 130b that are adjacent to each other, an interface between the second and third color separating lens arrays 130b and 130c that are adjacent to each other, and an interface between the third and first color separating lens arrays 130c and 130a that are adjacent to each other. Each groove 141 may extend in the first direction (the X direction). Although it is shown in FIG. 10 that an upper surface of the isolating layer 140 between adjacent grooves 141 is flat, the upper surface may also have a convex curved surface as shown in FIG. 9.

Figure 11:
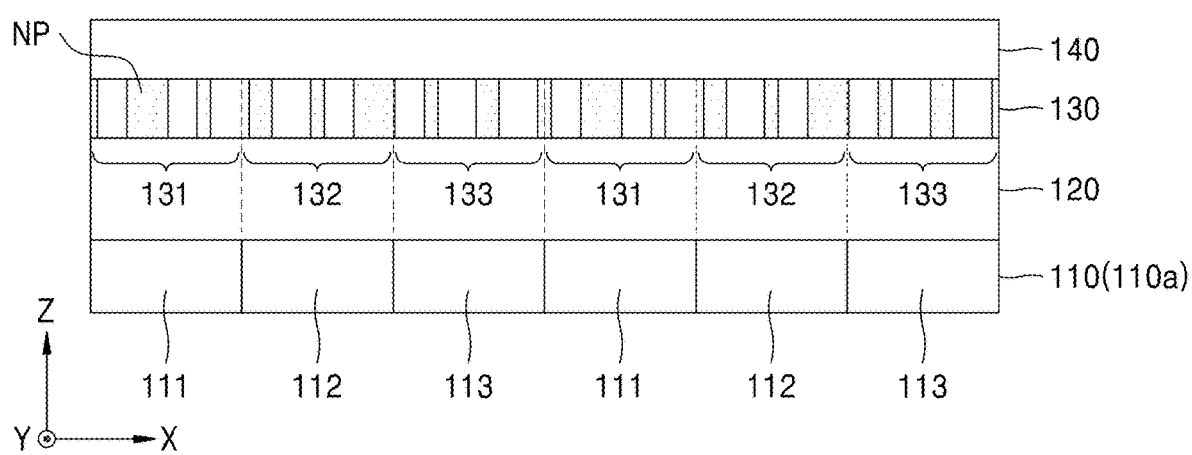
FIG. 11 is a schematic cross-sectional view showing a structure of a pixel array of an image sensor, according to another example embodiment.

FIG. 11 is a schematic cross-sectional view showing a structure of a pixel array of an image sensor, according to another example embodiment. For example FIG. 11 may correspond to a cross-sectional view along the line A-A' of FIG. 2A. Referring to FIG. 11, the isolating layer 140 may have a continuous form seamlessly in the first direction (the X direction).

Figure 12:
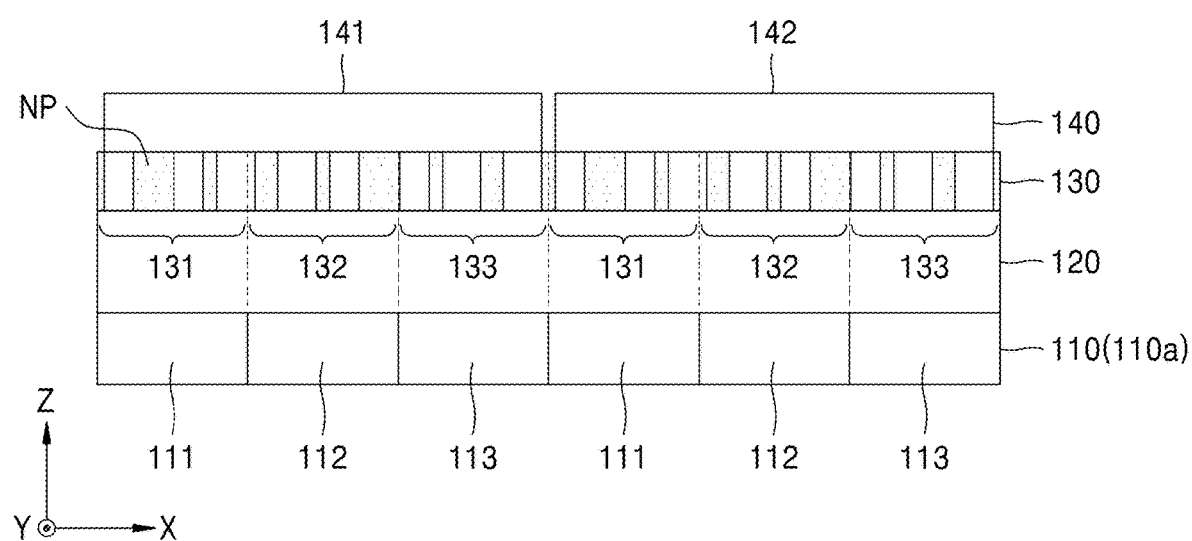
FIG. 12 is a schematic cross-sectional view showing a structure of a pixel array of an image sensor, according to another example embodiment.

FIG. 12 is a schematic cross-sectional view showing a structure of a pixel array of an image sensor, according to another example embodiment. For example FIG. 12 may correspond to a cross-sectional view along a line A-A' of FIG. 2A. Referring to FIG. 12, the isolating layer 140 may include a plurality of isolating elements 141 and 142 that are divided according to a unit pattern of the pixel array 1100. For example, the first isolating element 141 may be arranged to face the first to third pixels 111 to 113 in one unit pattern, and the second isolating element 142 may be arranged to face the first to third pixels 111 to 113 in another unit pattern. The first isolating element 141 and the second isolating element 142 may be completely separated from each other with a distance therebetween in the first direction (the X direction).

Figure 13:
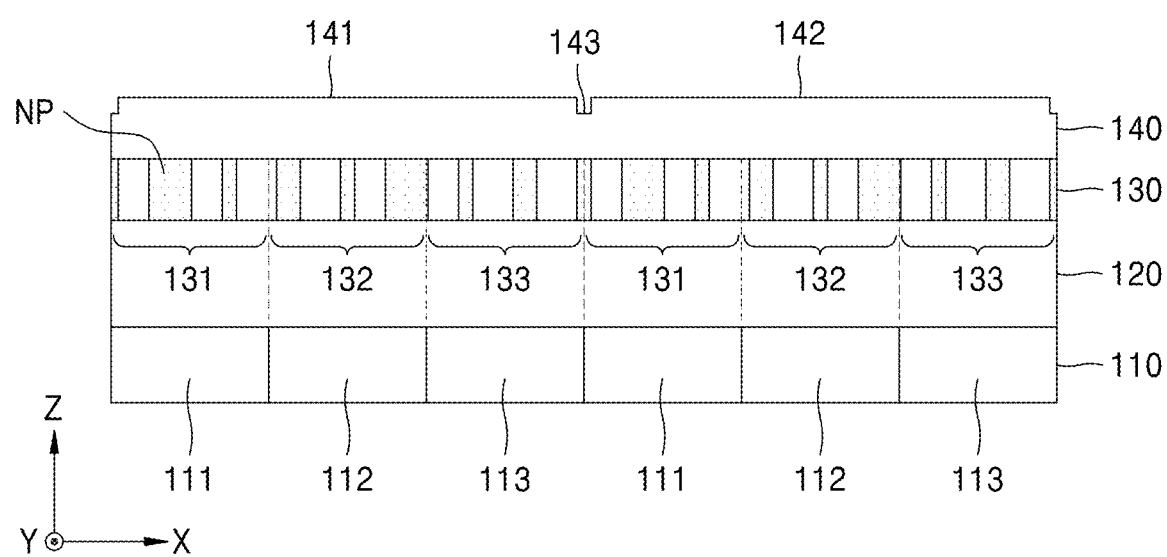
FIG. 13 is a schematic cross-sectional view showing a structure of a pixel array of an image sensor, according to another example embodiment.

FIG. 13 is a schematic cross-sectional view showing a structure of a pixel array of an image sensor, according to another example embodiment. For example FIG. 13 may correspond to y a cross-sectional view along the line A-A' of FIG. 2A. Referring to FIG. 13, the first isolating element 141 and the second isolating element 142 may not be completely separated from each other and may be connected to each other at lower portions thereof. On an upper surface of the isolating layer 140, a groove 142 extending in the second direction (the Y direction) may be formed to face a boundary between the first isolating element 141 and the second isolating element 142 or a boundary between two adjacent unit patterns, e.g., a boundary between the third pixel 113 and the first pixel 111.

Figure 14:
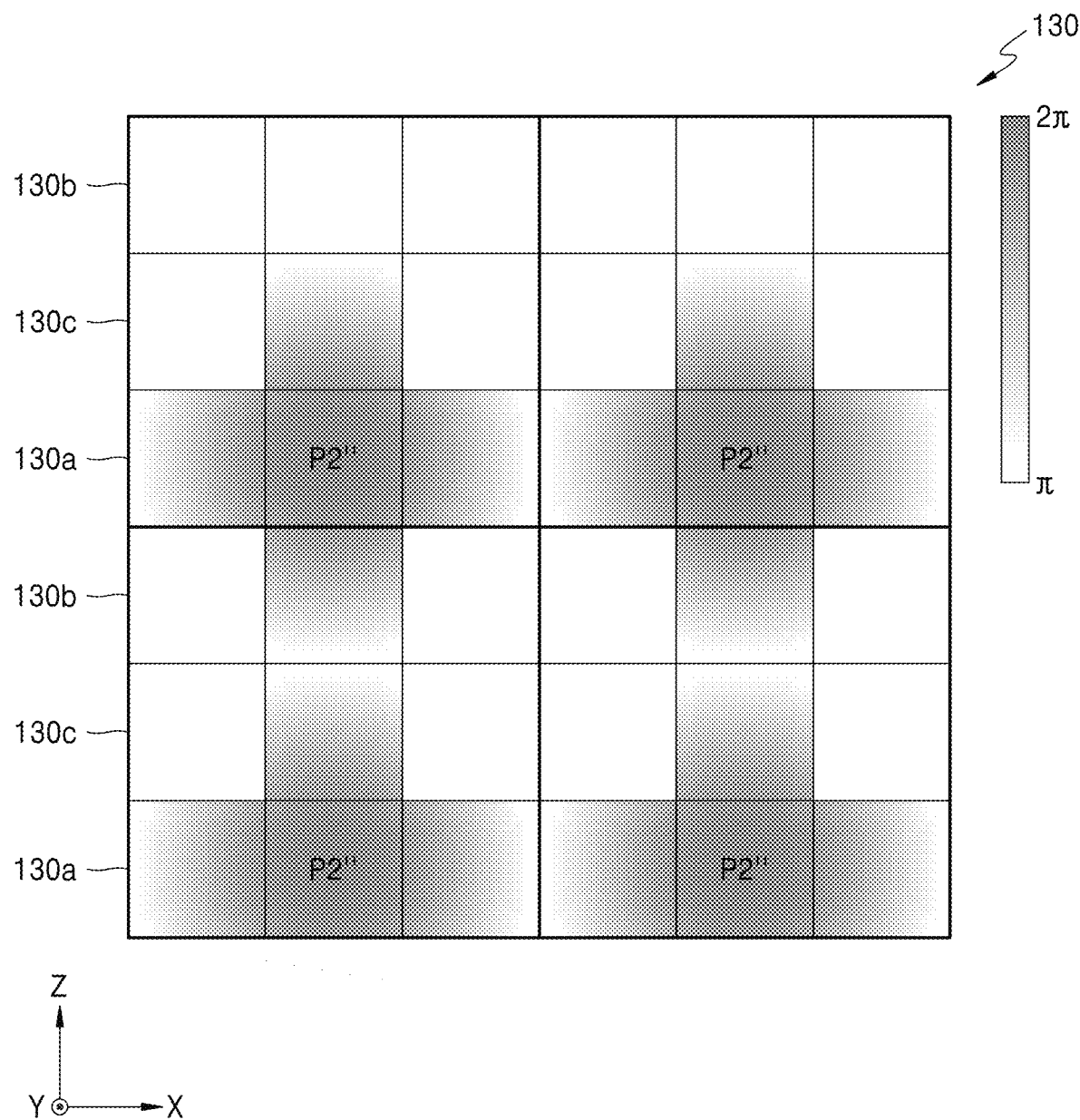
FIG. 14 is a plane view showing another example of a phase profile of light of a second wavelength having passed through a color separating lens array.

FIG. 14 is a plane view showing another example of a phase profile of the second wavelength light having passed through the color separating lens array 130 on the color separating lens array 130. So far, the first to third color separating lens arrays 130a, 130b, and 130c of the color separating lens array 130 are completely independent of one another optically. However, according to another example embodiment, the color separating lens array 130 may be designed to allow partial energy exchange between pixel corresponding regions of different color separating lens arrays, which are adjacent in the second direction (the Y direction). For example, because wavelength bands of light sensed by pixels that are immediately adjacent in the second direction (the Y direction) may partially overlap, the color separating lens arrays that are adjacent in the second direction (the Y direction) may further supply light for a pixel having a low sensitivity to a wavelength to be sensed.

Referring to FIG. 14, the second wavelength light having passed through the color separating lens array 130 may have a second phase profile P2" that is maximum at a center of the second pixel corresponding region 132, decreases away from the center of the second pixel corresponding region 132 in the first direction (the X direction), and decreases away from the center of the second pixel corresponding region 132 in the second direction (the Y direction). At a position immediately after passing through the color separating lens array 130, the phase of the second wavelength light may be maximum at the center of the second pixel corresponding region 132, and may be minimum in the boundary between the third pixel corresponding region 133 and the first pixel corresponding region 131 in the first direction (the X direction) and in the boundary between the fifth pixel corresponding region 135 of the second color separating lens array 130b and the eighth pixel corresponding region 138 of the third color separating lens array 130c in the second direction (the Y direction).

For example, when the phase of the second wavelength light output from the center of the second pixel corresponding region 132 is set to 2π, the phase of the second wavelength light in the boundary between the third pixel corresponding region 133 and the first pixel corresponding region 131 may be about 0.9π to about 1.1π, and the phase of the second wavelength light in the boundary between the fifth pixel corresponding region 135 of the second color separating lens array 130b and the eighth pixel corresponding region 138 of the third color separating lens array 130c may be about 0.9π to about 1.1π. In particular, the phase of the second wavelength light may be greater than π and less than 2π at the centers of the fifth pixel corresponding region 135 and the eighth pixel corresponding region 138 that are adjacent to the second pixel corresponding region 132 in the second direction (the Y direction). In this case, the second wavelength light may be condensed onto the second pixel 112 from not only the first color separating lens array 130a, but also the second and third color separating lens arrays 130b and 130c. Thus, the strength of the second wavelength light supplied to the second pixel may increase, and the sensitivity of the second pixel 112 to the second wavelength light may be improved. Although the phase profile of the second wavelength light has been illustrated in FIG. 14, the present disclosure is not limited thereto. The nanostructures NP may be arranged to allow energy exchange between adjacent color separating lens arrays for one or more wavelength light selected from among the first wavelength light to the ninth wavelength light depending on a need.

According to the image sensor 1000 including the pixel array 1100 described above, light loss due to a colorfilter, e.g., an organic color filter, rarely occurs, and thus, a sufficient amount of light may be provided to pixels even when the pixels become smaller in size. Therefore, an ultra-high resolution, ultra-small, and highly sensitive multispectral image sensor having hundreds of millions of pixels or more may be manufactured. An exposure time for signal detection in an ultra-high resolution, ultra-small, and highly sensitive multispectral image sensor may be reduced, thereby improving a frame rate. Such an ultra-high resolution, ultra-small, and highly sensitive multispectral image sensor may be employed in various high-performance optical devices or high-performance electronic apparatuses, and thus may be used to sense a state of the skin, etc., inspect food, inspect other object materials or characteristics, etc. The electronic apparatuses may include, for example, smart phones, mobile phones, cell phones, personal digital assistants (PDAs), laptop computers, personal computers (PCs), a variety of portable devices, home appliances, surveillance cameras, medical cameras, vehicles, Internet of Things (IoT) devices, other mobile or non-mobile computing devices, without being limited thereto.

The electronic apparatuses may further include, in addition to the image sensor 1000, a processor for controlling the image sensor, for example, an application processor (AP), and may control a plurality of hardware or software elements and perform various data processes and operations by driving an operation system or application programs via the processor. The processor may further include a graphic processing unit (GPU) and/or an image signal processor. When an image signal processor is included in the processor, an image (or video) obtained by the image sensor may be stored and/or output by using the processor.

Figure 15:
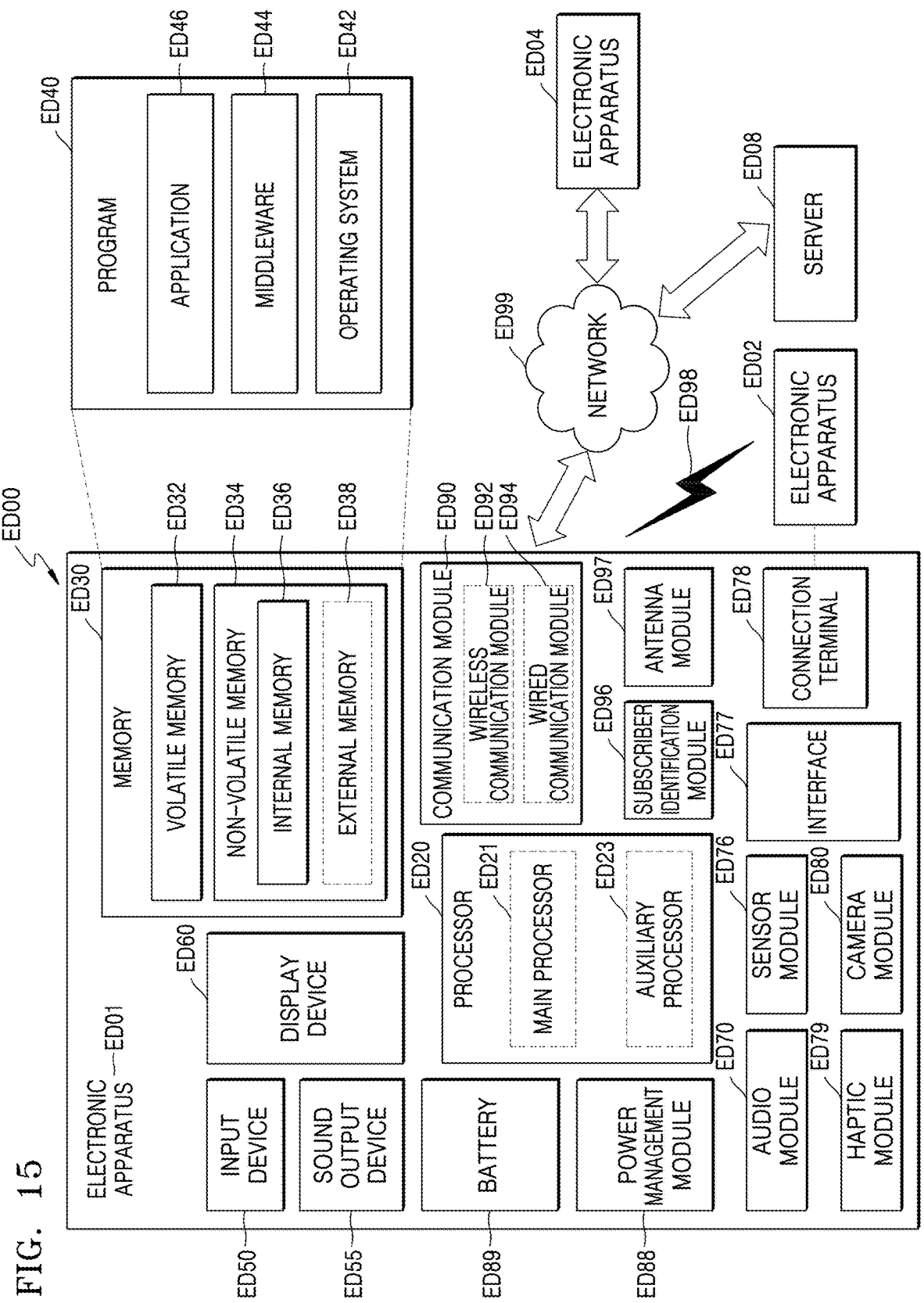
FIG. 15 is a block diagram schematically showing an electronic apparatus including an image sensor, according to example embodiments.

FIG. 15 is a block diagram showing an example of an electronic apparatus ED01 including the image sensor 1000. Referring to FIG. 15, in a network environment ED00, the electronic apparatus ED01 may communicate with another electronic apparatus ED02 via a first network ED98 (a short-range wireless communication network, etc.), or may communicate with another electronic apparatus ED04 and/ or a server ED08 via a second network ED99 (a remote-range wireless communication network, etc.). The electronic apparatus ED01 may communicate with the electronic apparatus ED04 via the server ED08. The electronic apparatus ED01 may include a processor ED20, a memory ED30, an input device ED50, a sound output device ED55, a display device ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. In the electronic apparatus ED01, some (the display device ED60, etc.) of the components may be omitted or another component may be added. Some of the components may be configured as one integrated circuit. For example, the sensor module ED76 (a fingerprint sensor, an iris sensor, an illuminance sensor, etc.) may be embedded and implemented in the display device ED60 (the display, etc.).

The processor ED20 may control one or more components (hardware, software components, etc.) of the electronic apparatus ED01 connected to the processor ED20 by executing software (the program ED40, etc.), and may perform various data processes or operations. As a part of the data processes or operations, the processor ED20 may load a command and/or data received from another component (the sensor module ED76, the communication module ED90, etc.) to a volatile memory ED32, may process the command and/or data stored in the volatile memory ED32, and may store result data in a non-volatile memory ED34. The processor ED20 may include a main processor ED21 (a central processing unit, an application processor, etc.) and an auxiliary processor ED23 (a GPU, ab image signal processor, a sensor hub processor, a communication processor, etc.) that may operate independently of or along with the main processor ED21. The auxiliary processor ED23 may use less power than that of the main processor ED21, and may perform specified functions.

The auxiliary processor ED23, on behalf of the main processor ED21 while the main processor ED21 is in an inactive state (a sleep state), or along with the main processor ED21 while the main processor ED21 is in an active state (an application executed state), may control functions and/or states related to some (the display device ED60, the sensor module ED76, the communication module ED90, etc.) of the components of the electronic apparatus ED01. The auxiliary processor ED23 (the image signal processor, the communication processor, etc.) may be implemented as a part of another component (the camera module ED80, the communication module ED90, etc.) that is functionally related thereto.

The memory ED30 may store various data required by the components (the processor ED20, the sensor module ED76, etc.) of the electronic apparatus ED01. The data may include, for example, software (the program ED40, etc.) and input data and/or output data about commands related thereto. The memory ED30 may include the volatile memory ED32 and/or the non-volatile memory ED34. The non-volatile memory ED34 may include an internal memory ED36 fixedly installed in the electronic apparatus ED01, and an external memory ED38 that is detachable from the internal memory ED 36.

The program ED40 may be stored as software in the memory ED30, and may include an operating system ED42, middleware ED44, and/or an application ED46.

The input device ED50 may receive commands and/or data to be used in the components (the processor ED20, etc.) of the electronic apparatus ED01, from the outside (a user, etc.) of the electronic apparatus ED01. The input device ED50 may include a microphone, a mouse, a keyboard, and/or a digital pen (a stylus pen).

The sound output device ED55 may output a sound signal to the outside of the electronic apparatus ED01. The sound output device ED55 may include a speaker and/or a receiver. The speaker may be used for a general purpose such as multimedia reproduction or record play, and the receiver may be used to receive a call. The receiver may be coupled as a part of the speaker or may be implemented as an independent separate device.

The display device ED60 may provide visual information to the outside of the electronic apparatus ED01. The display device ED60 may include a display, a hologram device, or a projector, and a control circuit for controlling the corresponding device. The display device ED60 may include a touch circuitry configured to sense a touch, and/or a sensor circuit (a pressure sensor, etc.) that is configured to measure a strength of a force generated by the touch.

The audio module ED70 may convert sound into an electrical signal or vice versa. The audio module ED70 may acquire sound through the input device ED50, or may output sound via the sound output device ED55 and/or a speaker and/or a headphone of another electronic apparatus (the electronic apparatus ED02, etc.) connected directly or wirelessly to the electronic apparatus ED01.

The sensor module ED76 may sense an operating state (power, temperature, etc.) of the electronic apparatus ED01, or an outer environmental state (a user state, etc.), and may generate an electrical signal and/or a data value corresponding to the sensed state. The sensor module ED76 may include a gesture sensor, a gyro sensor, a pressure sensor, a magnetic sensor, an acceleration sensor, a grip sensor, a proximity sensor, a color sensor, an infrared (IR) ray sensor, a vivo sensor, a temperature sensor, a humidity sensor, and/or an illuminance sensor.

The interface ED77 may support one or more designated protocols that may be used in order for the electronic apparatus ED01 to be directly or wirelessly connected to another electronic apparatus (the electronic apparatus ED02, etc.). The interface ED77 may include a high-definition multimedia interface (HDMI), a universal serial bus (USB) interface, an SD card interface, and/or an audio interface.

The connection terminal ED78 may include a connector by which the electronic apparatus ED01 may be physically connected to another electronic apparatus (the electronic apparatus ED02, etc.). The connection terminal ED78 may include an HDMI connector, a USB connector, an SD card connector, and/or an audio connector (a headphone connector, etc.).

The haptic module ED79 may convert the electrical signal into a mechanical stimulation (vibration, motion, etc.) or an electric stimulation that the user may sense through a tactile or motion sensation. The haptic module ED79 may include a motor, a piezoelectric device, and/or an electric stimulus device.

The camera module ED80 may capture a still image and a video. The camera module ED80 may include a lens assembly including one or more lenses, the image sensor 1000 of FIG. 1, image signal processors, and/or flashes. The lens assembly included in the camera module ED80 may collect light emitted from an object that is an object to be captured.

The power management module ED88 may manage the power supplied to the electronic apparatus ED01. The power management module ED88 may be implemented as a part of a power management integrated circuit (PMIC).

The battery ED89 may supply electric power to components of the electronic apparatus ED01. The battery ED89 may include a primary battery that is not rechargeable, a secondary battery that is rechargeable, and/or a fuel cell.

The communication module ED90 may support establishment of a direct (wired) communication channel and/or a wireless communication channel between the electronic apparatus ED01 and another electronic apparatus (the electronic apparatus ED02, the electronic apparatus ED04, the server ED08, etc.), and execution of communication through the established communication channel. The communication module ED90 may operate independently of the processor ED20 (the application processor, etc.), and may include one or more communication processors that support the direct communication and/or the wireless communication. The communication module ED90 may include a wireless communication module ED92 (a cellular communication module, a short-range wireless communication module, a global navigation satellite system (GNSS) communication module) and/or a wired communication module ED94 (a local area network (LAN) communication module, a power line communication module, etc.). From among the communication modules, a corresponding communication module may communicate with another electronic apparatus via a first network ED09 (a short-range communication network such as Bluetooth, Wireless Fidelity (WiFi) Direct, or Infrared Data Association (IrDA)) or a second network ED99 (a long-range communication network such as a cellular network, Internet, or a computer network (LAN, a wide area network (WAN), etc.)). Such various kinds of communication modules may be integrated as one component (a single chip, etc.) or may be implemented as a plurality of components (a plurality of chips) separately from one another. The wireless communication module ED92 may identify and authenticate the electronic apparatus ED01 in a communication network such as the first network ED98 and/or the second network ED99 by using subscriber information (an international mobile subscriber identifier (IMSI), etc.) stored in the subscriber identification module ED96.

The antenna module ED97 may transmit or receive a signal and/or power to/from outside (another electronic apparatus, etc.). An antenna may include a radiator formed as a conductive pattern formed on a substrate (a printed circuit board (PCB), etc.). The antenna module ED97 may include one or more antennas. When the antenna module ED97 includes a plurality of antennas, an antenna that is suitable for a communication scheme used in the communication network such as the first network ED98 and/or the second network ED99 may be selected by the communication module ED90 from among the plurality of antennas. The signal and/or the power may be transmitted between the communication module ED90 and another electronic apparatus via the selected antenna. Another component (a radio frequency integrated circuit (RFIC), etc.) other than the antenna may be included as a part of the antenna module ED97.

Some of the components may be connected to one another via a communication scheme between peripheral devices (a bus, general purpose input and output (GPIO), a serial peripheral interface (SPI), a mobile industry processor interface (MIPI), etc.) and may exchange signals (commands, data, etc.).

The command or data may be transmitted or received between the electronic apparatus ED01 and the external electronic apparatus ED04 via the server ED08 connected to the second network ED99. Other electronic apparatuses ED02 and ED04 may be devices of types that are the same as or different from the electronic apparatus ED01. All or some of operations executed in the electronic apparatus ED01 may be executed in one or more devices among the other electronic apparatuses ED02, ED04, and ED08. For example, when the electronic apparatus ED01 has to perform a certain function or service, the electronic apparatus ED01 may request one or more other electronic apparatuses to perform some or entire function or service, instead of executing the function or service by itself. One or more electronic apparatuses receiving the request execute an additional function or service related to the request and may transfer a result of the execution to the electronic apparatus ED01. For this end, cloud computing, distributed computing, and/or a client-server computing technique may be used.

Figure 16:
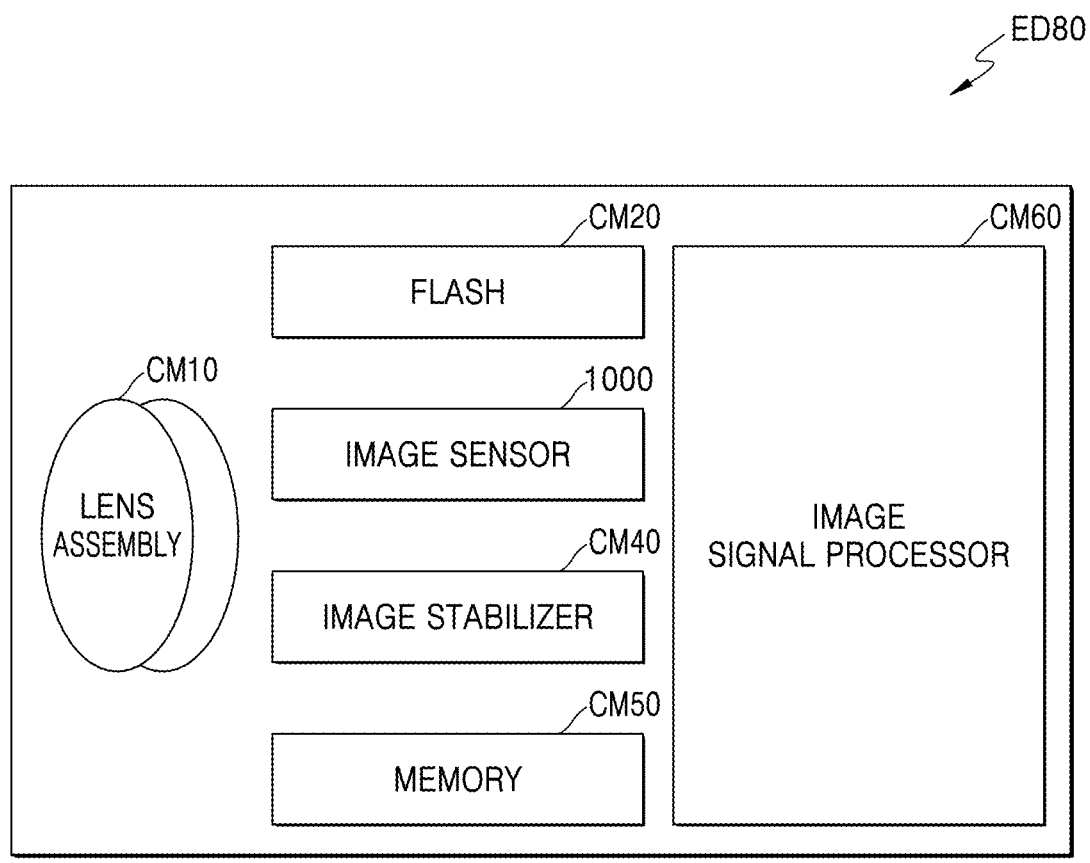
FIG. 16 is a block diagram schematically showing a camera module of FIG. 15.

FIG. 16 is a block diagram showing an example of the camera module ED80 of FIG. 15. Referring to FIG. 16, the camera module ED80 may include a lens assembly CM10, a flash CM20, the image sensor 1000 (the image sensor 1000 of FIG. 1, etc.), an image stabilizer CM40, a memory CM50 (a buffer memory, etc.), and/or an image signal processor CM60. The lens assembly CM10 may collect light emitted from an object that is an object to be captured. The camera module ED80 may include a plurality of lens assemblies CM10, and in this case, the camera module ED80 may include a dual camera, a 360-degree camera, or a spherical camera. Some of the plurality of lens assemblies CM10 may have the same lens properties (a viewing angle, a focal distance, auto-focus, an F number, optical zoom, etc.) or different lens properties. The lens assembly CM10 may include a wide-angle lens or a telephoto lens.

The flash CM20 may emit a light that is used to strengthen the light emitted or reflected from the object. The flash CM20 may include one or more light-emitting diodes (LEDs) (a red-green-blue (RGB) LED, a white LED, an infrared (IR) LED, an ultraviolet (UV) LED, etc.), and/or a Xenon lamp. The image sensor 1000 may be the image sensor described above with reference to FIG. 1, and convert the light emitted or reflected from the object and transferred through the lens assembly CM10 into an electrical signal to obtain an image corresponding to the object. The image sensor 1000 may include one or more sensors selected from among image sensors having different properties such as an RGB sensor, a black-and-white (BW) sensor, an IR sensor, and a UV sensor. Each of the sensors included in the image sensor 1000 may be implemented as a charge coupled device (CCD) sensor and/or a complementary metal oxide semiconductor (CMOS) sensor.

The image stabilizer CM40, in response to a motion of the camera module ED80 or the electronic apparatus ED01 including the camera module ED80, may move one or more lenses included in the lens assembly CM10 or the image sensor 1000 in a certain direction or control the operating characteristics of the image sensor 1000 (adjustment of a read-out timing, etc.) in order to compensate for a negative influence of the motion. The image stabilizer CM40 may sense the movement of the camera module ED80 or the electronic apparatus ED01 by using a gyro sensor or an acceleration sensor arranged in or out of the camera module ED80. The image stabilizer CM40 may be implemented as an optical type.

The memory CM50 may store some or entire data of an image obtained through the image sensor 1000 for a next image processing operation. For example, when a plurality of images are obtained at a high speed, obtained original data (Bayer-patterned data, high resolution data, etc.) may be stored in the memory CM50, and a low-resolution image may be displayed and then original data of a selected (user-selected, etc.) image may be transferred to the image signal processor CM60. The memory CM50 may be integrated with the memory ED30 of the electronic apparatus ED01, or may include a separate memory that operates independently.

The image signal processor CM60 may perform image processing on the image obtained through the image sensor 1000 or the image data stored in the memory CM50. The image processing may include depth map generation, three-dimensional modeling, panorama generation, extraction of features, image combination, and/or image compensation (noise reduction, resolution adjustment, brightness adjustment, blurring, sharpening, softening, etc.). The image signal processor CM60 may perform controlling (exposure time control, read-out timing control, etc.) of the components (the image sensor 1000, etc.) included in the camera module ED80. The image processed by the image signal processor CM60 may be stored again in the memory CM50 for additional processing, or may be provided to an external component of the camera module ED80 (e.g., the memory ED30, the display device ED60, the electronic apparatus ED02, the electronic apparatus ED04, the server ED08, etc.). The image signal processor CM60 may be integrated with the processor ED20, or may be configured as an additional processor that operates independently of the processor ED20. When the image signal processor CM60 is configured as an additional processor separately from the processor ED20, the image processed by the image signal processor CM60 may undergo additional image processing by the processor ED20 and then may be displayed on the display device ED60.

The electronic apparatus ED01 may include a plurality of camera modules ED80 having different properties or functions. In this case, one of the plurality of camera modules ED80 may include a wide-angle camera and another may include a telephoto camera. Similarly, one of the plurality of camera modules ED80 may include a front camera and another may include a rear camera.

Figure 17:
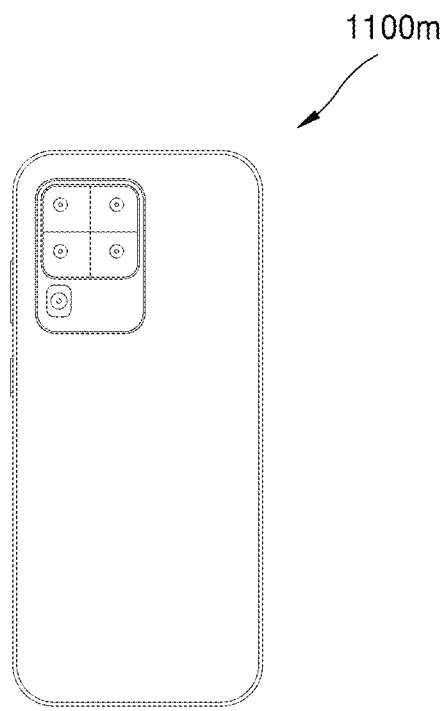
FIGS. 17 through 26 show various examples of an electronic apparatus to which image sensors according to example embodiments are applied.
Figure 18:
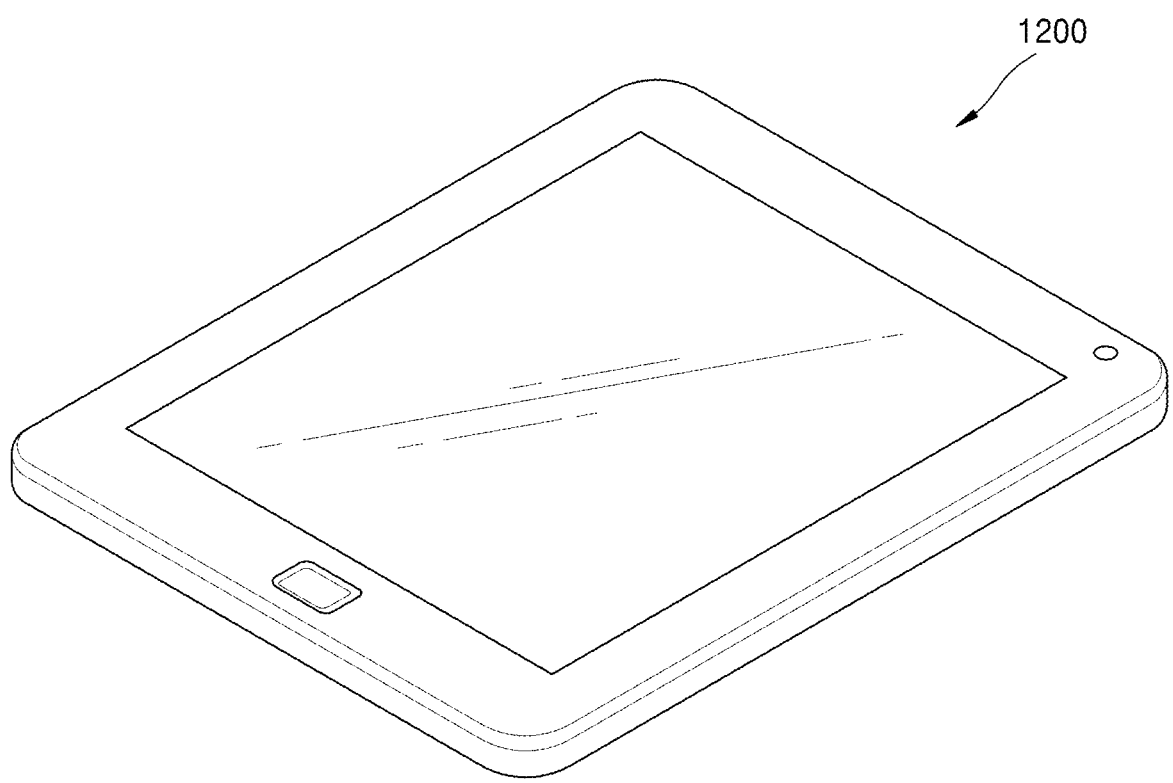
Figure 19:
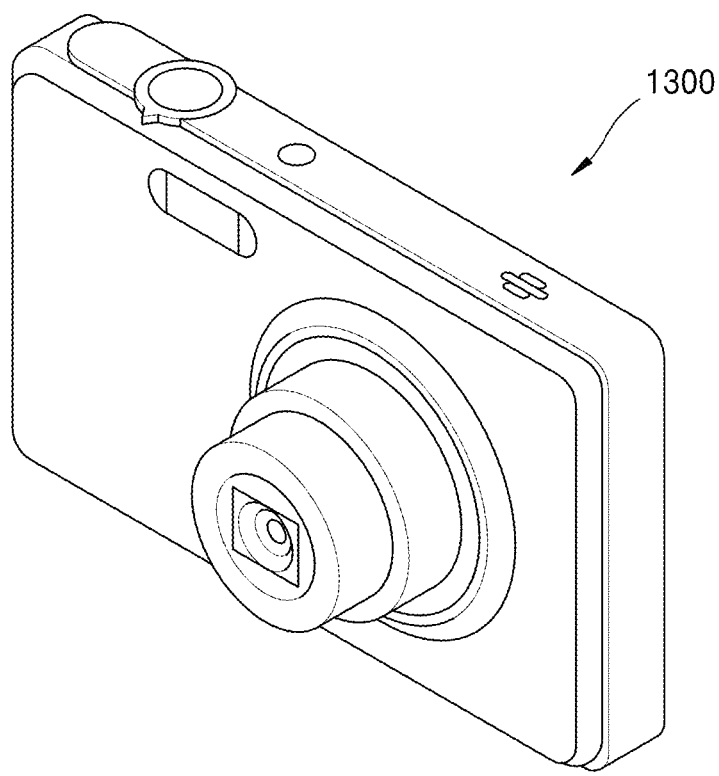
Figure 20:
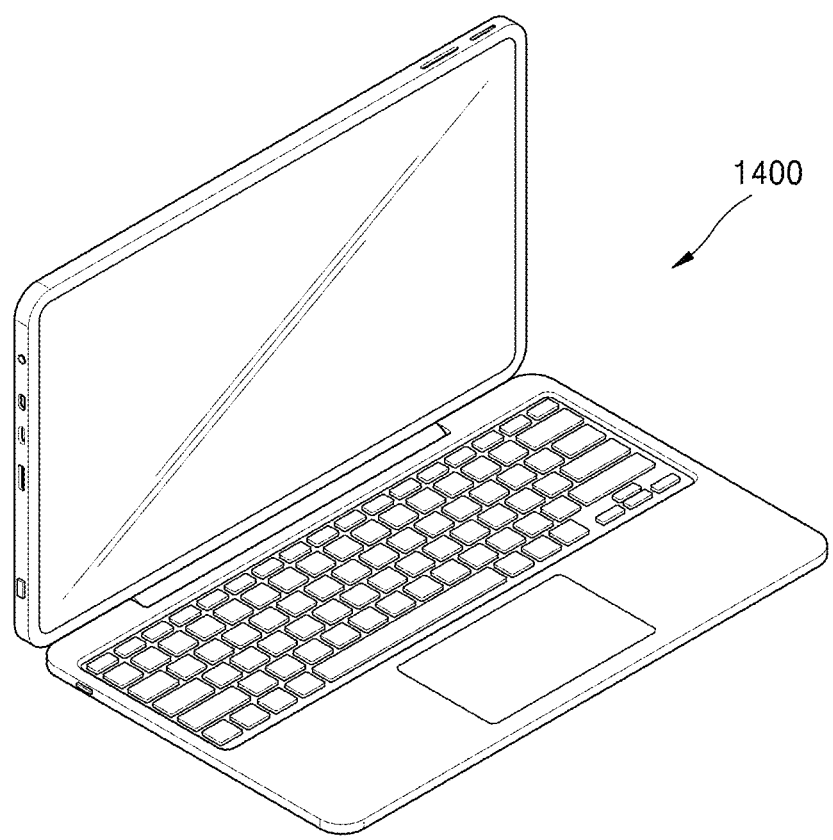
Figure 21:
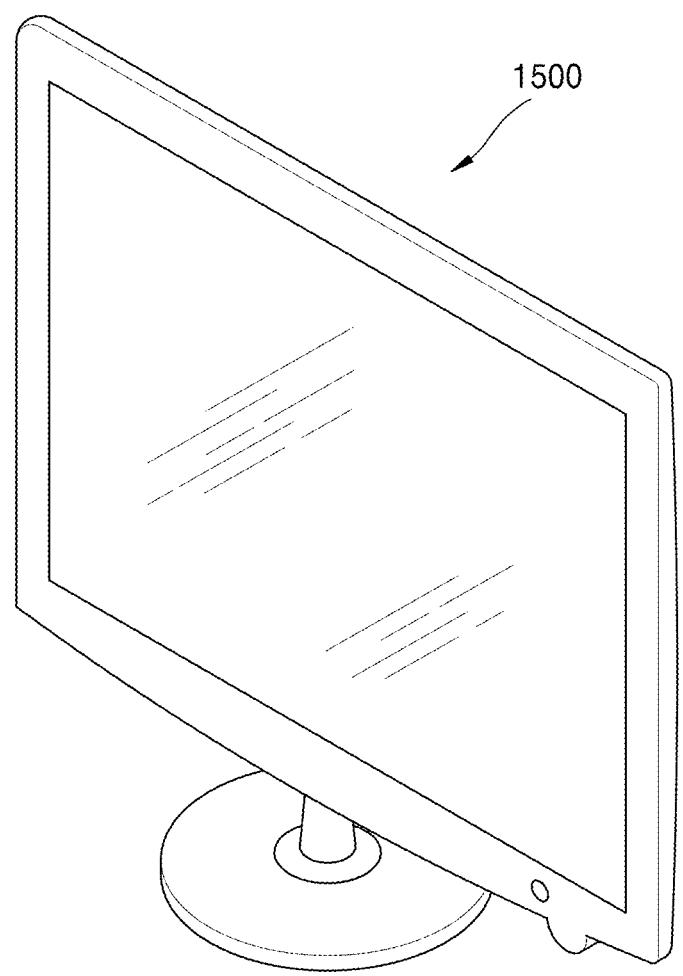

The image sensor 1000 according to the example embodiments may be applied to a mobile phone or smartphone 1100m shown in FIG. 17, a tablet or smart tablet 1200 shown in FIG. 18, a digital camera or camcorder 1300 shown in FIG. 19, a laptop computer 1400 shown in FIG. 20, or a television or smart television 1500 shown in FIG. 21. For example, the smartphone 1100m or the smart tablet 1200 may include a plurality of high-resolution cameras each including a high-resolution image sensor. Depth information of objects in an image may be extracted, out focusing of the image may be adjusted, or objects in the image may be automatically identified, by using the high-resolution cameras.

Figure 22:
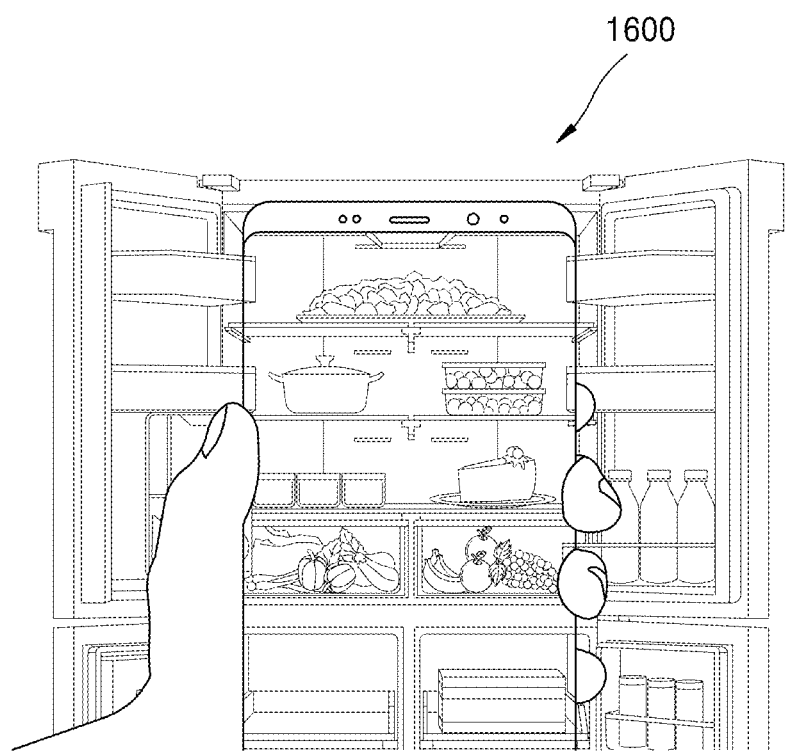
Figure 23:
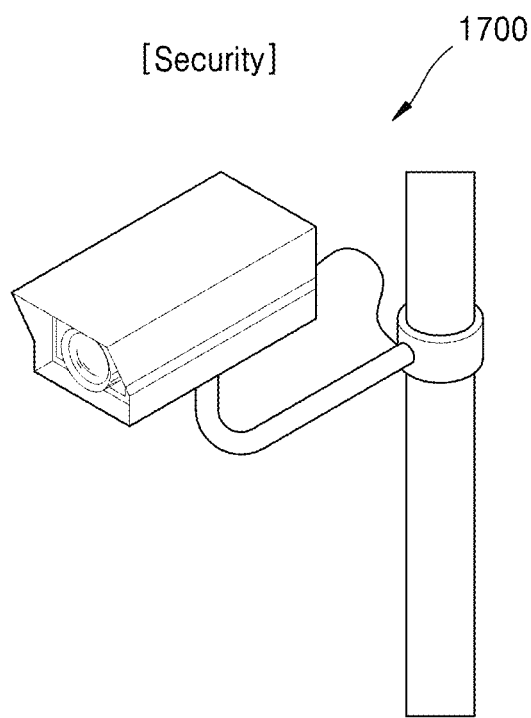
Figure 24:
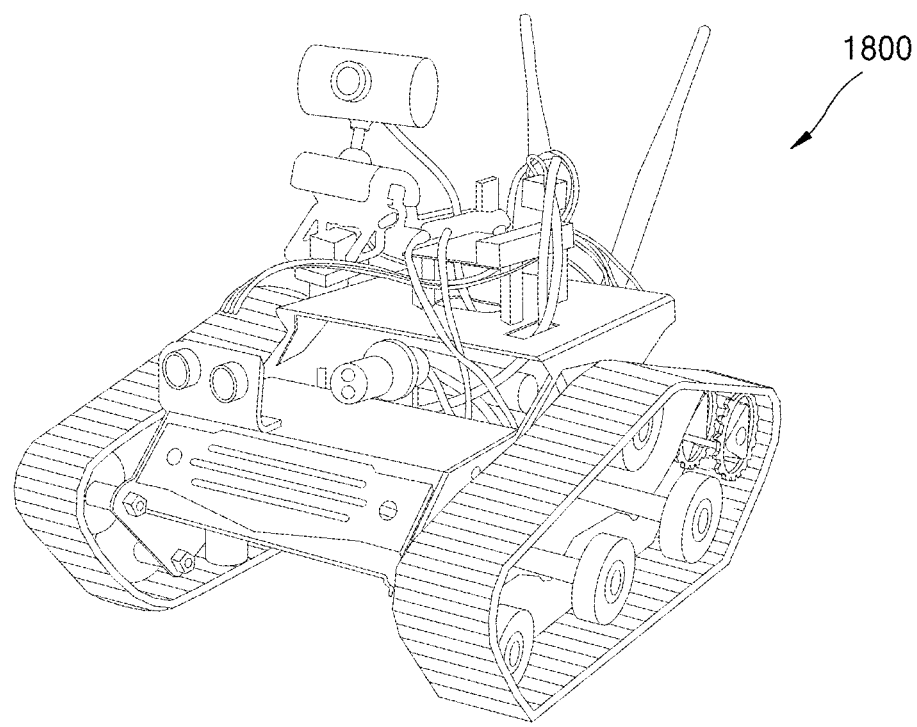
Figure 25:
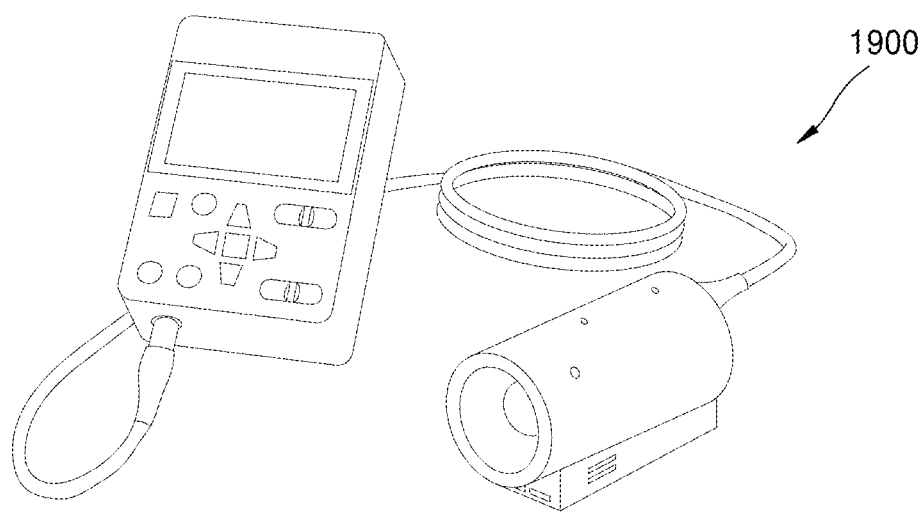

Also, the image sensor 1000 may be applied to a smart refrigerator 1600 shown in FIG. 22, a surveillance camera 1700 shown in FIG. 23, a robot 1800 shown in FIG. 24, a medical camera 1900 shown in FIG. 25, etc. For example, the smart refrigerator 1600 may automatically recognize food in the refrigerator by using the image sensor, and may notify the user of existence of a certain kind of food, kinds of food put into or taken out, etc., through a smartphone. Also, the surveillance camera 1700 may provide an ultra-high-resolution image and may allow the user to recognize an object or a person in the image even in a dark environment by using high sensitivity. The robot 1900 may be put to a disaster or industrial site that a person may not directly access to provide the user with high-resolution images. The medical camera 1900 may provide high-resolution images for diagnosis or surgery, and may dynamically adjust a field of view.

Figure 26:
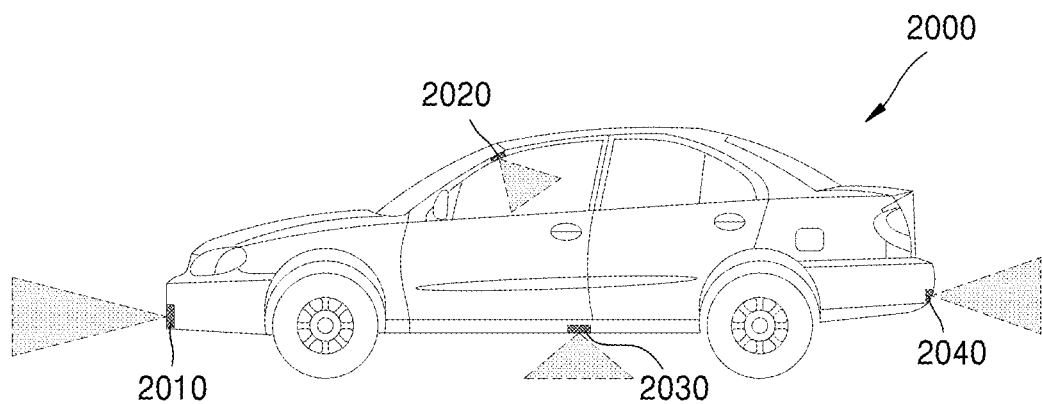

Also, the image sensor 1000 may be applied to a vehicle 2000 as shown in FIG. 26. The vehicle 2000 may include a plurality of vehicle cameras 2010, 2020, 2030, and 2040 arranged at various locations. Each of the vehicle cameras 2010, 2020, 2030, and 2040 may include the image sensor according to the example embodiments. The vehicle 2000 may provide a driver with various information about the interior of the vehicle 2000 or the periphery of the vehicle 2000 by using the plurality of vehicle cameras 2010, 2020, 2030, and 2040, and may provide the driver with information necessary for autonomous traveling by automatically recognizing an object or a person in the image.

It should be understood that example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:

1. An image sensor comprising:
   a sensor substrate comprising a first pixel row and a second pixel row, the first pixel row comprising a plurality of first pixels arranged in a first direction and the second pixel row comprising a plurality of second pixels arranged in the first direction, the second pixel row being adjacent to the first pixel row in a second direction;
   a spacer layer that is transparent and is provided on the sensor substrate; and
   a color separating lens array provided on the spacer layer and comprising a plurality of nanostructures,
   wherein the color separating lens array comprises:
      a first color separating lens array extending in the first direction over the first pixel row and comprising a plurality of first nanostructures, among the plurality of nanostructures, configured to separate from light incident on the first color separating lens array, light of a plurality of first wavelengths within a first spectral range and condense the light of the plurality of first wavelengths onto the plurality of first pixels of the first pixel row; and
      a second color separating lens array extending in the first direction over the second pixel row and comprising a plurality of second nanostructures, among the plurality of nanostructures, configured to separate from light incident on the second color separating lens array, light of a plurality of second wavelengths within a second spectral range different from the first spectral range and condense the light of the plurality of second wavelengths onto the plurality of second pixels of the second pixel row,
      wherein the second color separating lens array is adjacent to the first color separating lens array in the second direction.

2. The image sensor of claim 1, wherein the first color separating lens array is further configured to condense the light incident on the first color separating lens array onto only the plurality of first pixels of the first pixel row, and the second color separating lens array is configured to condense light incident on the second color separating lens array onto only the plurality of second pixels of the second pixel row.

3. The image sensor of claim 2, further comprising an isolating layer arranged on the color separating lens array, the isolating layer configured to prevent energy exchange between the first color separating lens array and the second color separating lens array.

4. The image sensor of claim 3, wherein the isolating layer comprises a first transparent bar extending in the first direction on the first color separating lens array and a second transparent bar extending in the first direction on the second color separating lens array.

5. The image sensor of claim 3, wherein the isolating layer comprises a transparent flat plate comprising a groove formed concavely in the first direction at a position corresponding to an interface between the first color separating lens array and the second color separating lens array.

6. The image sensor of claim 3, wherein an upper surface of the isolating layer comprises a convex curved surface and the upper surface of the isolating layer has refractive power in the second direction.

7. The image sensor of claim 1, wherein the first spectral range and the second spectral range partially overlap each other.

8. The image sensor of claim 1, wherein a first wavelength gap between the plurality of first wavelengths within the first spectral range separated by the first color separating lens array and a second wavelength gap between the plurality of second wavelengths within the second spectral range separated by the second color separating lens array are within a range of about 30 nm to about 300 nm.

9. The image sensor of claim 1, wherein the plurality of first pixels of the first pixel row comprise a first pixel, a second pixel, and a third pixel that are alternately arranged in the first direction, and
wherein the plurality of second pixels of the second pixel row comprise a fourth pixel, a fifth pixel, and a sixth pixel that are alternately arranged in the first direction.

10. The image sensor of claim 9, wherein the first color separating lens array is configured to:
change a phase of light of a first wavelength from the light incident on the first color separating lens array, and condense the phase-changed light of the first wavelength onto the first pixel,
change a phase of light of a second wavelength from the light incident on the first color separating lens array, and condense the phase-changed light of the second wavelength onto the second pixel, and
change a phase of light of a third wavelength from the light incident on the first color separating lens array, and condense the phase-changed light of the third wavelength onto the third pixel, and
the second color separating lens array is configured to:
change a phase of light of a fourth wavelength from the light incident on the second color separating lens array, and condense the phase-changed light of the fourth wavelength onto the fourth pixel,
change a phase of light of a fifth wavelength from the light incident on the second color separating lens array, and condense the phase-changed light of the fifth wavelength onto the fifth pixel, and
change a phase of light of a sixth wavelength from the light incident on the second color separating lens array, and condense the phase-changed light of the sixth wavelength onto the sixth pixel.

11. The image sensor of claim 10, wherein the first color separating lens array comprises a first region corresponding to the first pixel, a second region corresponding to the second pixel, and a third region corresponding to the third pixel, the first region, the second region and the third region are alternately arranged in the first direction,
the second color separating lens array comprises a fourth region corresponding to the fourth pixel, a fifth region corresponding to the fifth pixel, and a sixth region corresponding to the sixth pixel, the fourth region, the fifth region and the sixth region are alternately arranged in the first direction,
the first region is arranged to face the first pixel,
the second region is arranged to face the second pixel,
the third region is arranged to face the third pixel,
the fourth region is arranged to face the fourth pixel,
the fifth region is arranged to face the fifth pixel, and
the sixth region is arranged to face the sixth pixel.

12. The image sensor of claim 11, wherein, each of the first region, the second region, and the third region comprise the plurality of nanostructures that are arranged such that:
the light of the first wavelength at a position immediately after passing through the first color separating lens array has a phase of about $2\pi$ at a first position corresponding to a central portion of the first pixel and has a phase of about $0.9\pi$ to about $1.1\pi$ in a boundary between the second pixel and the third pixel,
the light of the second wavelength at the position immediately after passing through the first color separating lens array has a phase of about $2\pi$ at a second position corresponding to a central portion of the second pixel and has a phase of about $0.9\pi$ to about $1.1\pi$ in a boundary between the third pixel and the first pixel, and the light of the third wavelength at the position immediately after passing through the first color separating lens array has a phase of about $2\pi$ at a third position corresponding to a central portion of the third pixel and has a phase of about $0.9\pi$ to about $1.1\pi$ in a boundary between the first pixel and the second pixel.

13. The image sensor of claim 12, wherein the plurality of nanostructures are arranged such that the light of the first wavelength, the light of the second wavelength, and the light of the third wavelength, which have passed through the first color separating lens array, do not proceed to the fourth pixel, the fifth pixel, and the sixth pixel.

14. The image sensor of claim 12, wherein a first-direction width of each of the plurality of nanostructures of the first region, the second region, and the third region is less than a shortest wavelength among the first wavelength, the second wavelength, and the third wavelength.

15. The image sensor of claim 11, wherein, each of the first region, the second region, the third region, the fourth region, the fifth region and the sixth region comprises the plurality of nanostructures, which are arranged such that the light of the first wavelength at a position immediately after passing through the color separating lens array has a phase greater than about $1\pi$ and less than about $2\pi$ at a position corresponding to the fourth pixel that is adjacent to the first pixel in the second direction.

16. The image sensor of claim 10, wherein a first wavelength gap between the first wavelength and the fourth wavelength is less than a second wavelength gap between the first wavelength and the second wavelength.

17. The image sensor of claim 16, wherein the first wavelength gap between the first wavelength and the fourth wavelength is within a range of about 10 nm to about 100 nm.

18. An electronic apparatus comprising:
an image sensor configured to convert an optical image into an electrical signal;
a processor configured to control an operation of the image sensor and store and output a signal generated by the image sensor; and
a lens assembly configured to provide light corresponding to an object to the image sensor,
wherein the image sensor comprises:
a sensor substrate comprising a first pixel row and a second pixel row, the first pixel row comprising a plurality of first pixels arranged in a first direction and the second pixel row comprising a plurality of second pixels arranged in the first direction, the second pixel row being adjacent to the first pixel row in a second direction;
a spacer layer that is transparent and is provided on the sensor substrate; and
a color separating lens array provided on the spacer layer and comprising a plurality of nanostructures,
wherein the color separating lens array comprises:
a first color separating lens array extending in the first direction over the first pixel row and comprising a plurality of first nanostructures, among the plurality of nanostructures, configured to separate from light incident on the first color separating lens array, light of a plurality of first wavelengths within a first spectral range and condense the light of the plurality of first wavelengths onto the plurality of first pixels of the first pixel row; and
a second color separating lens array extending in the first direction over the second pixel row and comprising a plurality of second nanostructures, among the plurality of nanostructures, configured to separate from light incident on the second color separating lens array, light of a plurality of second wavelengths within a second spectral range different from the first spectral range and condense the light of the plurality of second wavelengths onto the plurality of second pixels of the second pixel row, wherein the second color separating lens array is adjacent to the first color separating lens array in the second direction.

19. An image sensor comprising:

a sensor substrate comprising a first pixel row and a second pixel row, the first pixel row comprising a plurality of first pixels arranged in a first direction and the second pixel row comprising a plurality of second pixels arranged in the first direction, the second pixel row being adjacent to the first pixel row in a second direction; and a color separating lens array provided spaced apart from the sensor substrate and comprising a plurality of nanostructures, wherein the color separating lens array comprises:

a first color separating lens array extending in the first direction and comprising a plurality of first nanostructures, among the plurality of nanostructure, the plurality of first nanostructures being configured to:

separate from light incident on the first color separating lens array, light of a plurality of first wavelengths within a first spectral range, condense the light of the plurality of first wavelengths onto the plurality of first pixels of the first pixel row, and prevent the light of the plurality of first wavelengths from being condensed onto one or more of the plurality of second pixels of the second pixel row; and a second color separating lens array extending in the first direction and adjacent to the first color separating lens array in the second direction, the second color separating lens array comprising a plurality of second nanostructures, among the plurality of nanostructures.

* * * * *